United States Patent
Long et al.

(10) Patent No.: US 11,651,739 B2
(45) Date of Patent: May 16, 2023

(54) SHIFT REGISTER UNIT, SCANNING DRIVE CIRCUIT, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Benlian Wang, Beijing (CN); Yuanjie Xu, Beijing (CN); Yingsong Xu, Beijing (CN); Lili Du, Beijing (CN); Tingliang Liu, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/456,492

(22) Filed: Nov. 24, 2021

(65) Prior Publication Data
US 2022/0246100 A1    Aug. 4, 2022

(30) Foreign Application Priority Data

Feb. 1, 2021 (CN) .......................... 202110137028.X

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2020/0388227 A1* 12/2020 Yang ................... G09G 3/3266

* cited by examiner

*Primary Examiner* — Christopher J Kohlman
(74) *Attorney, Agent, or Firm* — Brooks Kushman P.C.

(57) ABSTRACT

A shift register unit, a scanning drive circuit, a display substrate, and a display device are provided. The shift register unit includes an output end, a node control end, a first output node control circuit, a second output node control circuit and an output circuit, the second node control circuit is electrically connected to a first clock signal line, the node control end, the first output node and the second node; the first output node control circuit is electrically connected to the second node and the first output node and is configured to control a potential of the first output node; the second output node control circuit is electrically connected to the second node and the second output node; the output circuit is electrically connected to a first output node, a second output node, a first voltage line, a second voltage line and an output end.

19 Claims, 12 Drawing Sheets

SHIFT REGISTER UNIT, SCANNING DRIVE CIRCUIT, DISPLAY SUBSTRATE AND DISPLAY DEVICE

CROSS-REFERENCE TO RELATED APPLICATION

This application claims priority to Chinese Patent Application No. 202110137028.X filed on Feb. 1, 2021, the disclosure of which is incorporated herein by reference in its entirety.

TECHNICAL FIELD

The present disclosure relates to the field of display technologies, and in particular, to a shift register unit, a scanning drive circuit, a display substrate, and a display device.

BACKGROUND

In the related art AMOLED (active matrix organic light emitting diode) display apparatus, a pixel compensation circuit is required to drive the organic light emitting device. A typical pixel compensation circuit requires a scanning drive circuit to supply a light emission control signal to the pixel compensation circuit. The shift register unit in the scanning drive circuit in the related art has a problem of troublesome wiring.

SUMMARY

A shift register unit is provided in the present disclosure, including an output end, a node control end, a first output node control circuit, a second output node control circuit and an output circuit, the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node.

Optionally, the shift register unit further includes an input end; the first output node control circuit is further electrically connected to the input end, the first output node, a first clock signal line, a second clock signal line, and a first voltage line, and is configured to, under the control of the first clock signal, write an input signal provided by the input end into the first output node, and control the potential of the first output node according to a potential of the second node, the second clock signal, and the first voltage signal;

the second clock signal line is configured to provide the second clock signal, and the first voltage line is configured to provide the first voltage signal.

Optionally, the node control end is the first clock signal line.

Optionally, the shift register unit includes an output end being a K-th stage output end, and the node control end is a (K+N)-th stage output end;

K and N are both positive integers;

the (K+N)-th stage light-emitting control signal end is configured to provide an effective voltage signal when the input end provides an ineffective voltage signal.

Optionally, the second node control circuit includes a first transistor and a second transistor, wherein, a control electrode of the first transistor and a first electrode of the first transistor are both electrically connected to the first clock signal line, and a second electrode of the first transistor is electrically connected to the second node;

a control electrode of the second transistor is electrically connected to the first output node, a first electrode of the second transistor is electrically connected to the first clock signal line, and a second electrode of the second transistor is electrically connected to the second node.

Optionally, the first output node control circuit includes a third transistor, a fourth transistor, a fifth transistor, and a first capacitance;

a control electrode of the third transistor is electrically connected to the first clock signal line, a first electrode of the third transistor is electrically connected to the input end, and a second electrode of the third transistor is electrically connected to the first output node;

a control electrode of the fourth transistor is electrically connected to the second clock signal line, and a second electrode of the fourth transistor is electrically connected to the first output node;

a control electrode of the fifth transistor is electrically connected to the second node, a first electrode of the fifth transistor is electrically connected to the first voltage line, and a second electrode of the fifth transistor is electrically connected to the first electrode of the fourth transistor;

a first electrode plate of the first capacitor is electrically connected to the first output node, and a second electrode plate of the first capacitor is electrically connected to the second clock signal line.

Optionally, the first output node control circuit includes a third transistor, a fourth transistor, a fifth transistor, and a first capacitance;

a control electrode of the third transistor is electrically connected to the first clock signal line, a first electrode of the third transistor is electrically connected to the input end, and a second electrode of the third transistor is electrically connected to the first output node;

a control electrode of the fourth transistor is electrically connected to the first output node, and a second electrode of the fourth transistor is electrically connected to the second clock signal line;

a control electrode of the fifth transistor is electrically connected to the second node, a first electrode of the fifth transistor is electrically connected to the first voltage line, and a second electrode of the fifth transistor is electrically connected to the first electrode of the fourth transistor;

a first electrode plate of the first capacitor is electrically connected to the first output node, and a second electrode plate of the first capacitor is electrically connected to the first electrode of the fourth transistor.

Optionally, the shift register unit further includes a first isolation circuit;

the first isolation circuit is electrically connected to a first control voltage line and configured to control a first isolation node to be communicated with the first output node under a control of a first control voltage provided by the first control voltage line;

the first output node control circuit is configured to, under the control of the first clock signal, write an input signal provided by the input end into the first isolation node, and when the first isolation circuit controls communication between the first isolation node and the first output node, write the input signal into the first output node;

the second node control circuit is directly electrically connected to the first isolation node, and the second node control circuit is electrically connected to the first output node through the first isolation circuit; the second node control circuit is configured to control the first clock signal to be written into the second node under the control of the potential of the first isolation node.

Optionally, the shift register unit further includes a second isolation circuit;

the second output node control circuit is electrically connected to the second node through the second isolation circuit;

the second isolation circuit is further electrically connected to a second control voltage line and configured to control the second node to be communicated with the second output node control circuit under the control of a second control voltage provided by the second control voltage line.

Optionally, the second output node control circuit is electrically connected to the first output node, the second node, a second clock signal line, and a first voltage line respectively, and is configured to control a potential of the second output node based on the second clock signal, a potential of the second node and the first voltage signal under a control of a potential of the second node, a potential of the first output node, and the second clock signal, and configured to maintain the potential of the second output node.

Optionally, the second output node control circuit includes a third node control sub-circuit and a second output node control sub-circuit, wherein, the third node control sub-circuit is electrically connected to the second node, the second clock signal line and a third node respectively, and is configured to write a second clock signal into the third node under the control of the potential of the second node and adjust a potential of the third node according to the potential of the second node;

the second output node control sub-circuit is electrically connected to the third node, the second clock signal line, the second output node, the first output node and the first voltage line, and is configured to control a communication between the third node and the second output node under the control of the second clock signal, is configured to write a first voltage signal into the second output node under a control of the potential of the first output node, and is configured to maintain the potential of the second output node.

Optionally, the third node control sub-circuit includes a sixth transistor and a second capacitor;

a control electrode of the sixth transistor is electrically connected to the second node, a first electrode of the sixth transistor is electrically connected to the second clock signal line, and a second electrode of the sixth transistor is electrically connected to the third node;

a first electrode plate of the second capacitor is electrically connected to the second node, and a second electrode plate of the second capacitor is electrically connected to the third node;

the second output node control sub-circuit includes a seventh transistor, an eighth transistor and a third capacitor;

a control electrode of the seventh transistor is electrically connected to the second clock signal line, a first electrode of the seventh transistor is electrically connected to the third node, and a second electrode of the seventh transistor is electrically connected to the second output node;

a control electrode of the eighth transistor is electrically connected to the first output node, a first electrode of the eighth transistor is electrically connected to the first voltage line, and a second electrode of the eighth transistor is electrically connected to the second output node;

a first electrode plate of the third capacitor is electrically connected to the second output node, and a second electrode plate of the third capacitor is electrically connected to the first voltage line.

Optionally, the output circuit includes a ninth transistor and a tenth transistor, wherein, a control electrode of the ninth transistor is electrically connected to the second output node, a first electrode of the ninth transistor is electrically connected to the first voltage line, and a second electrode of the ninth transistor is electrically connected to the output end;

a control electrode of the tenth transistor is electrically connected to the first output node, a first electrode of the tenth transistor is electrically connected to the output end, and a second electrode of the tenth transistor is electrically connected to the second voltage line.

A scan driving circuit is further provided in the present disclosure, including a plurality of stages of shift register units, wherein each of the shift register units includes an output end, a node control end, a first output node control circuit, a second output node control circuit and an output circuit, wherein the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node.

Optionally, the shift register unit includes an input end;

excepting for a first stage of shift register unit, the input end of each stage of shift register unit is electrically connected to the output end of the adjacent upper stage of shift register unit.

Optionally, the K-th stage shift register unit includes a K-th stage node control end and a K-th stage input end;

the K-th stage node control end is electrically connected to the (K+N)-th stage output end;

K and N are both positive integers;

the (K+N)-th stage light-emitting control signal end is configured to provide an effective voltage signal when the K-th stage input end provides an ineffective voltage signal.

A display substrate is further provided in the present disclosure, including a scanning drive circuit and a display region arranged on a substrate, the scanning drive circuit includes a plurality of shift register units, the shift register unit includes an output end, a node control end, a first output node control circuit, a second output node control circuit and an output circuit, wherein the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node;

the scanning drive circuit further includes a first voltage line, a second voltage line and a clock signal line, where the clock signal line includes a first clock signal line and a second clock signal line; the first voltage line, the second voltage line, the first clock signal line, and the second clock signal line extend along a first direction, the display region includes at least one driving transistor configured to drive a light emitting element to display;

the first clock signal line and the second clock signal line are positioned on one side of the second voltage line far away from the display area, the shift register unit is positioned between the second voltage line and the clock signal line, and the orthographic projection of the shift register unit on the substrate is at least partially overlapped with the projection of the first voltage line on the substrate.

Optionally, the shift register unit includes a second node control circuit between the clock signal line and the first voltage line.

Optionally, the second node control circuit includes a first transistor; a gate of the first transistor is electrically connected to a conductive connecting part, and the gate of the first transistor and the conductive connecting part are both formed on the first grid metal layer; the conductive connecting part is connected to the first clock signal line through a corresponding via hole, so that the gate of the first transistor is electrically connected to the first clock signal line;

the source electrode of the first transistor is electrically connected to the first conductive connecting part through the corresponding through hole; the conductive connection part is electrically connected to the first conductive connection part through a corresponding via hole to enable the source electrode of the first transistor to electrically connect to the first clock signal line;

the first conductive connecting part and the first clock signal line are formed on the source drain metal layer, and the source electrode of the first transistor is formed on the active layer.

A display device including the scanning drive circuit hereinabove is further provided in the present disclosure.

DETAILED DESCRIPTION

The technical solutions in the embodiments of the present disclosure will be described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative effort, shall fall within the protection scope of the present disclosure.

The transistors used in all embodiments of the present disclosure may be transistors, thin film transistors, or field effect transistors or other devices with the same characteristics. In the embodiments of the present disclosure, to distinguish two poles of a transistor except for a control pole, one pole is referred to as a first pole, and the other pole is referred to as a second pole.

In practical operation, when the transistor is a triode, the control electrode may be a base electrode, the first electrode may be a collector electrode, and the second electrode may be an emitter electrode; alternatively, the control electrode may be a base electrode, the first electrode may be an emitter electrode, and the second electrode may be a collector electrode.

In practical operation, when the transistor is a thin film transistor or a field effect transistor, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

Figure 1:
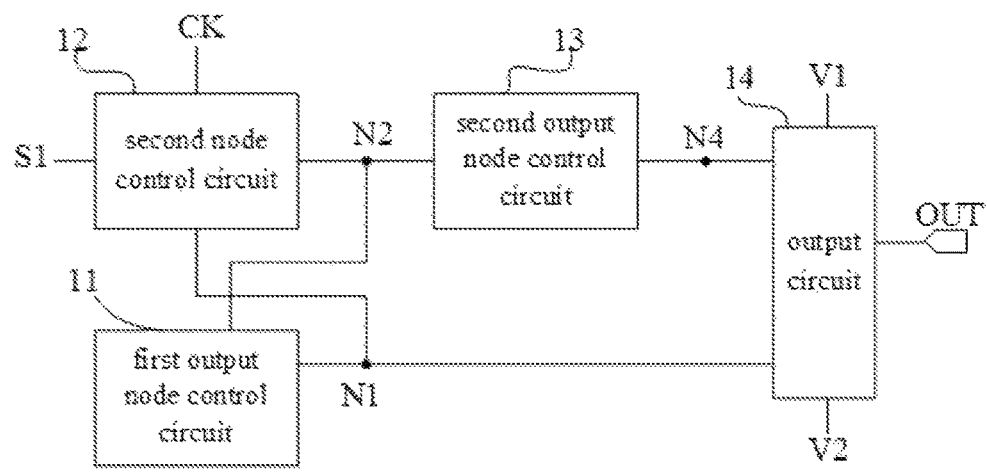
FIG. 1 is a block diagram of a shift register unit according to at least one embodiment of the disclosure.

As shown in FIG. 1, the shift register unit according to the embodiment of the present disclosure includes an output end OUT, a node control end S1, a first output node control circuit 11, a second node control circuit 12, a second output node control circuit 13, and an output circuit 14, wherein, the second node control circuit 12 is electrically connected to the first clock signal line CK, the node control end S1, the first output node N1 and the second node N2, respectively, and is configured to control, under the control of the first clock signal provided by the first clock signal line CK, the node control signal provided by the node control end S1 to be provided to the second node N2, and further configured to control the potential of the second node N2 according to the potential of the first output node N1 and the first clock signal;

the first output node control circuit 11 is electrically connected to the second node N2 and a first output node N1, respectively, for controlling the potential of the first output node N1;

the second output node control circuit 13 is electrically connected to the second node N2 and a second output node N4, respectively, for controlling the potential of the second output node N4;

the output circuit 14 is electrically connected to the first output node N1, the second output node N4, the first voltage line V1, the second voltage line V2 and the output end OUT, respectively, and is configured to control a light emitting control signal output by the output end OUT according to a first voltage signal provided by the first voltage line V1 and a second voltage signal provided by the second voltage line V2 under control of a potential of the first output node N1 and a potential of the second output node N4.

In the shift register unit according to the embodiment of the present disclosure, the second node control circuit 12 is electrically connected to the node control end S1, so as to facilitate wiring and avoid the problem of troublesome wiring.

In the embodiment of the present disclosure, the first voltage line may be a high voltage line, and the second voltage line may be a low voltage line, but not limited thereto.

Figure 2:
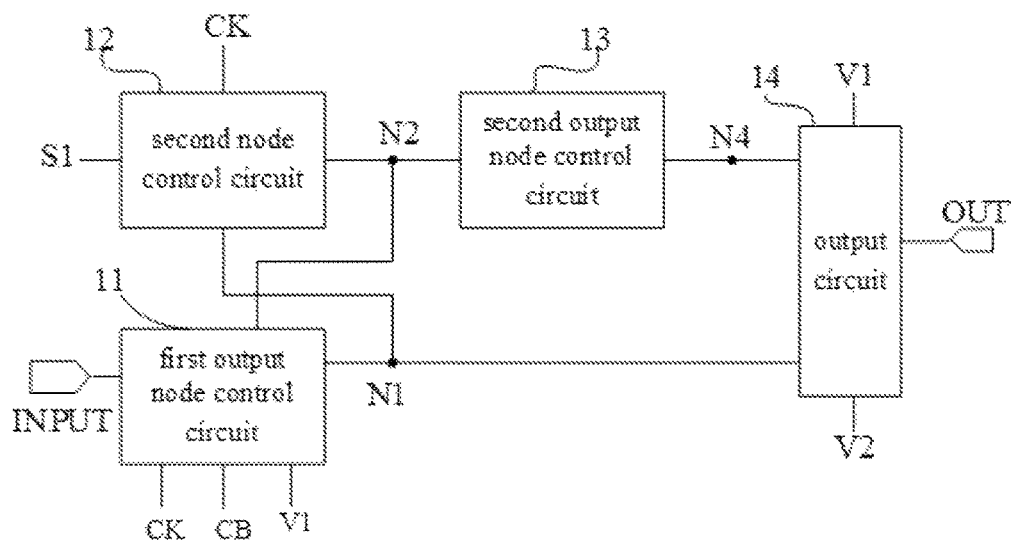
FIG. 2 is a block diagram of a shift register unit according to at least one embodiment of the present disclosure.

As shown in FIG. 2, on the basis of the embodiment of the shift register unit shown in FIG. 1, the shift register unit according to the embodiment of the present disclosure further includes an INPUT terminal INPUT; the first output node control circuit 11 is further electrically connected to the INPUT terminal INPUT, the first output node N1, a first clock signal line CK, a second clock signal line CB, and a first voltage line V1, and is configured to, under the control of the first clock signal, write an INPUT signal provided by the INPUT terminal INPUT into the first output node N1, and control a potential of the first output node N1 according to a potential of the second node N2, a second clock signal, and a first voltage signal;

the second clock signal line CB is configured to provide the second clock signal, and the first voltage line V1 is configured to provide the first voltage signal.

Optionally, the node control end is the first clock signal line.

Figure 3:
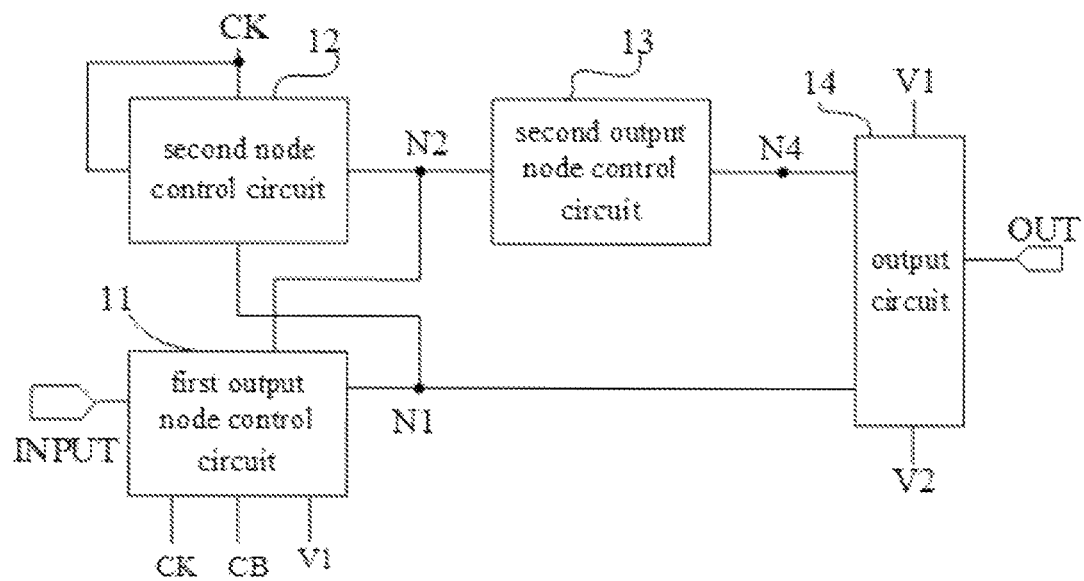
FIG. 3 is a block diagram of a shift register unit according to at least one embodiment of the present disclosure.

As shown in FIG. 3, on the basis of the embodiment of the shift register unit shown in FIG. 2, the node control end is the first clock signal line CK;

the second node control circuit 12 is electrically connected to the first clock signal line CK for easy wiring.

In the embodiment of the present disclosure, the shift register unit may include an output end that is a K-th-stage output end, and the node control end is a K+N-stage output end;

K and N are both positive integers;

the (K+N)-th stage light-emitting control signal end is configured to provide an effective voltage signal when the input end provides an ineffective voltage signal.

In the embodiment of the present disclosure, when the light emission control transistor, the gate of which is connected to the light emission control signal, in the pixel circuit is an n-type transistor, the invalid voltage signal may be a low voltage signal, and the valid voltage signal may be a high voltage signal;

when the light emission control transistor is a p-type transistor, the invalid voltage signal may be a high voltage signal, and the valid voltage signal may be a low voltage signal, but not limited thereto.

Figure 4:
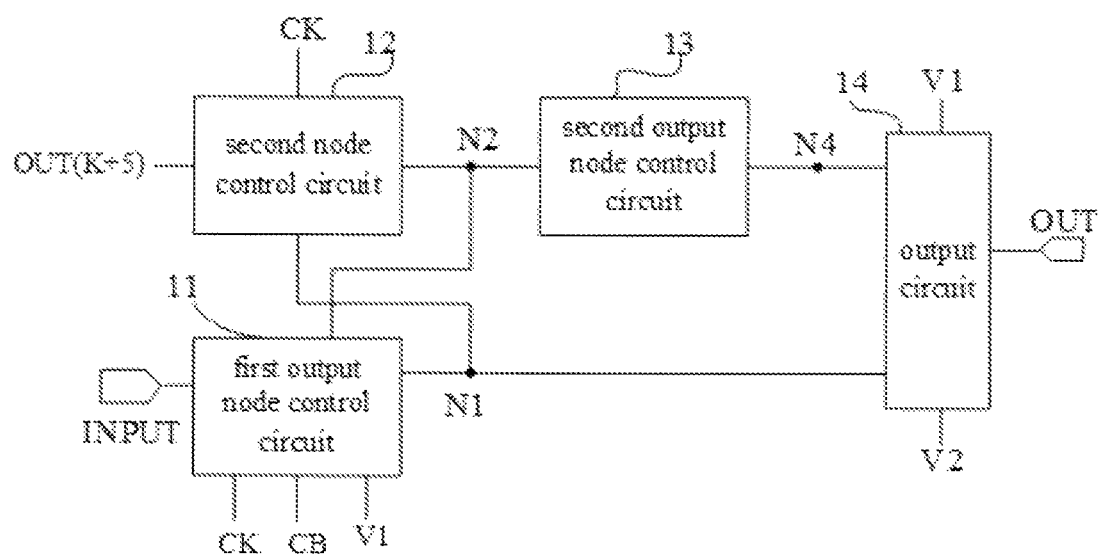
FIG. 4 is a block diagram of a shift register unit according to at least one embodiment of the present disclosure.

As shown in FIG. 4, on the basis of the embodiment of the shift register unit shown in FIG. 2, OUT is the K-th stage light-emitting control signal terminal, N is equal to 5, and the node control end is the (K+5)-th stage light-emitting control signal terminal OUT (c);

the second node control circuit 12 is electrically connected to the K+5th-level emission control signal terminal OUT (K+5);

OUT (K+5) provides a low voltage signal when INPUT provides a high voltage signal.

Optionally, the second node control circuit comprises a first transistor and a second transistor, a control electrode of the first transistor and a first electrode of the first transistor are both electrically connected to the first clock signal line, and a second electrode of the first transistor is electrically connected to the second node;

a control electrode of the second transistor is electrically connected to the first output node, a first electrode of the second transistor is electrically connected to the first clock signal line, and a second electrode of the second transistor is electrically connected to the second node.

According to an embodiment of the present disclosure, the first output node control circuit may include a third transistor, a fourth transistor, a fifth transistor, and a first capacitor;

a control electrode of the third transistor is electrically connected to the first clock signal line, a first electrode of the third transistor is electrically connected to the input end, and a second electrode of the third transistor is electrically connected to the first output node;

a control electrode of the fourth transistor is electrically connected to the second clock signal line, and a second electrode of the fourth transistor is electrically connected to the first output node;

a control electrode of the fifth transistor is electrically connected to the second node, a first electrode of the fifth transistor is electrically connected to the first voltage line, and a second electrode of the fifth transistor is electrically connected to the first electrode of the fourth transistor;

the first electrode plate of the first capacitor is electrically connected to the first output node, and the second electrode plate of the first capacitor is electrically connected to the second clock signal line.

According to another specific embodiment, the first output node control circuit includes a third transistor, a fourth transistor, a fifth transistor, and a first capacitor;

a control electrode of the third transistor is electrically connected to the first clock signal line, a first electrode of the third transistor is electrically connected to the input end, and a second electrode of the third transistor is electrically connected to the first output node;

a control electrode of the fourth transistor is electrically connected to the first output node, and a second electrode of the fourth transistor is electrically connected to the second clock signal line;

a control electrode of the fifth transistor is electrically connected to the second node, a first electrode of the fifth transistor is electrically connected to the first voltage line, and a second electrode of the fifth transistor is electrically connected to the first electrode of the fourth transistor;

a first electrode plate of the first capacitor is electrically connected to the first output node, and a second electrode plate of the first capacitor is electrically connected to the first electrode of the fourth transistor.

Optionally, the shift register unit according to at least one embodiment of the present disclosure may further include a first isolation circuit;

the first isolation circuit is electrically connected to a first control voltage line and configured to control the first isolation node to be communicated with the first output node under the control of a first control voltage provided by the first control voltage line;

the first output node control circuit is configured to, under control of the first clock signal, write an input signal provided by the input end into a first isolation node, and when the first isolation circuit controls communication between the first isolation node and the first output node, write the input signal into the first output node;

the second node control circuit is directly electrically connected to the first isolation node, and the second node control circuit is electrically connected to the first output node through the first isolation circuit; the second node control circuit is configured to control the first clock signal to be written into the second node under the control of the potential of the first isolation node.

In at least one embodiment of the present disclosure, when the first isolation transistor included in the first isolation circuit is a p-type transistor, the first control voltage line may be a low voltage line.

In particular implementations, the first isolation circuit may include a first isolation transistor;

a control electrode of the first isolation transistor is electrically connected to the first control voltage line, a first electrode of the first isolation transistor is electrically connected to the first isolation node, and a second electrode of the first isolation transistor is electrically connected to the first output node.

Optionally, the shift register unit according to at least one embodiment of the present disclosure may further include a second isolation circuit;

the second output node control circuit is electrically connected to the second node through the second isolation circuit;

the second isolation circuit is further electrically connected to a second control voltage line and configured to control the second node to be communicated with the second output node control circuit under the control of a second control voltage provided by the second control voltage line.

In at least one embodiment of the present disclosure, when the second isolation transistor included in the second isolation circuit is a p-type transistor, the second control voltage line may be a low voltage line.

In particular implementations, the second isolation circuit may include a second isolation transistor;

a control electrode of the second isolation transistor is electrically connected to the second control voltage line, a first electrode of the second isolation transistor is electrically connected to the second node, and a second electrode of the first isolation transistor is electrically connected to the second output node control circuit.

In a specific implementation, the second output node control circuit may be electrically connected to the first output node, the second clock signal line, and the first voltage line, respectively, and configured to control a potential of the second output node according to the second clock signal, the potential of the second node, and the first voltage signal, and to maintain the potential of the second output node under control of a potential of the second node, a potential of the first output node, and the second clock signal.

In the embodiment of the present disclosure, the second output node control circuit may control the potential of the second output node under control of the potential of the second node, the potential of the first output node, and the second clock signal, and the second output node control circuit may be further configured to maintain the potential of the second output node.

In an embodiment of the present disclosure, the second output node control circuit may include a third node control sub-circuit and a second output node control sub-circuit, wherein, the third node control sub-circuit is electrically connected to the second node, the second clock signal line and a third node respectively, and is configured to write a second clock signal into the third node under the control of the potential of the second node and adjusting the potential of the third node according to the potential of the second node;

the second output node control sub-circuit is electrically connected to the third node, the second clock signal line, the second output node, the first output node and the first voltage line, is configured to control the communication between the third node and the second output node under the control of the second clock signal, is configured to write a first voltage signal into the second output node under the control of the potential of the first output node, and is configured to maintain the potential of the second output node.

In a specific implementation, the second output node control circuit may include a third node control sub-circuit and a second output node control sub-circuit, the third node control sub-circuit adjusts a potential of a third node, and the second output node control sub-circuit controls a potential of the second output node.

Figure 5:
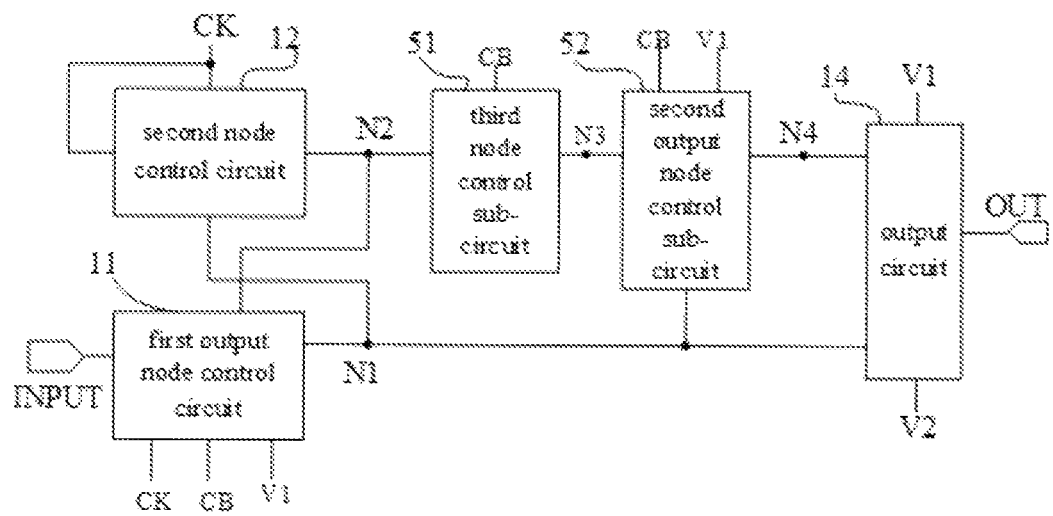
FIG. 5 is a block diagram of a shift register unit according to at least one embodiment of the present disclosure.

As shown in FIG. 5, on the basis of the embodiment of the shift register unit shown in FIG. 3, the second output node control circuit includes a third node control sub-circuit 51 and a second output node control sub-circuit 52, wherein, the third node control sub-circuit 51 is electrically connected to the second node N2, the second clock signal line CB, and a third node N3, respectively, and is configured to write a second clock signal into the third node N3 under the control of the potential of the second node N2, and adjust the potential of the third node N3 according to the potential of the second node N2;

the second output node control sub-circuit 52 is electrically connected to the third node N3, the second clock signal line CB, the second output node N4, the first output node N1, and the first voltage line V1, respectively, and is configured to control communication between the third node N3 and the second output node N4 under control of the second clock signal, to write a first voltage signal into the second output node N4 under control of a potential of the first output node N1, and to maintain a potential of the second output node N4.

Figure 6:
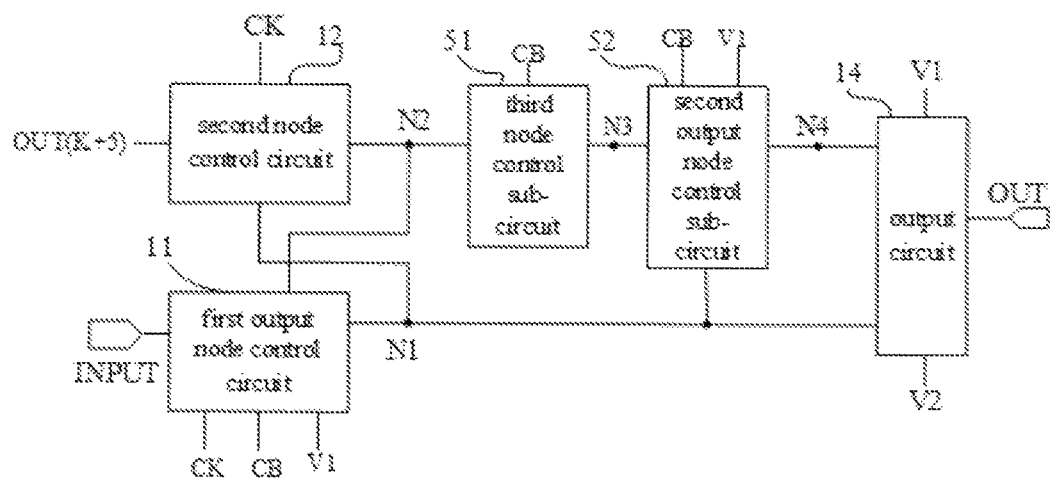
FIG. 6 is a block diagram of a shift register unit according to at least one embodiment of the present disclosure.

As shown in FIG. 6, on the basis of the embodiment of the shift register unit shown in FIG. 4, the second output node control circuit includes a third node control sub-circuit 51 and a second output node control sub-circuit 52, wherein, the third node control sub-circuit 51 is electrically connected to the second node N2, the second clock signal line CB, and a third node N3, respectively, and is configured to write a second clock signal into the third node N3 under the control of the potential of the second node N2, and adjust the potential of the third node N3 according to the potential of the second node N2;

the second output node control sub-circuit 52 is electrically connected to the third node N3, the second clock signal line CB, the second output node N4, the first output node N1, and the first voltage line V1, respectively, and is configured to control communication between the third node N3 and the second output node N4 under control of the second clock signal, to write a first voltage signal into the second output node N4 under control of a potential of the first output node N1, and to maintain a potential of the second output node N4.

Optionally, the third node control sub-circuit includes a sixth transistor and a second capacitor;

a control electrode of the sixth transistor is electrically connected to the second node, a first electrode of the sixth transistor is electrically connected to the second clock signal line, and a second electrode of the sixth transistor is electrically connected to the third node;

the first electrode plate of the second capacitor is electrically connected to the second node, and the second electrode plate of the second capacitor is electrically connected to the third node;

the second output node control sub-circuit comprises a seventh transistor, an eighth transistor and a third capacitor;

a control electrode of the seventh transistor is electrically connected to the second clock signal line, a first electrode of the seventh transistor is electrically connected to the third node, and a second electrode of the seventh transistor is electrically connected to the second output node;

a control electrode of the eighth transistor is electrically connected to the first output node, a first electrode of the eighth transistor is electrically connected to the first voltage line, and a second electrode of the eighth transistor is electrically connected to the second output node;

the first electrode plate of the third capacitor is electrically connected to the second output node, and the second electrode plate of the third capacitor is electrically connected to the first voltage line.

Optionally, the output circuit includes a ninth transistor and a tenth transistor, wherein a control electrode of the ninth transistor is electrically connected to the second output node, a first electrode of the ninth transistor is electrically connected to the first voltage line, and a second electrode of the ninth transistor is electrically connected to the output end;

a control electrode of the tenth transistor is electrically connected to the first output node, a first electrode of the tenth transistor is electrically connected to the output end, and a second electrode of the tenth transistor is electrically connected to the second voltage line.

Figure 7:
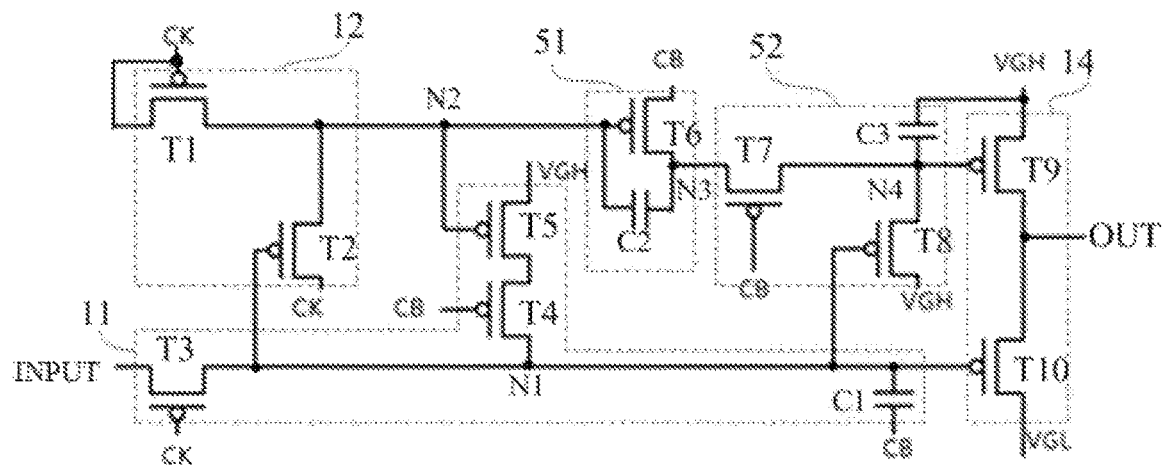
FIG. 7 is a circuit diagram of a shift register unit according to at least one embodiment of the present disclosure.

As shown in FIG. 7, on the basis of the embodiment of the shift register unit shown in FIG. 5, the second node control circuit 12 includes a first transistor T1 and a second transistor T2, the gate electrode of the first transistor T1 and the source electrode of the first transistor T1 are electrically connected to the first clock signal line CK, and the drain electrode of the first transistor T1 is electrically connected to the second node N2;

a gate of the second transistor T2 is electrically connected to the first output node N1, a source of the second transistor T2 is electrically connected to the first clock signal line CK, and a drain of the second transistor T2 is electrically connected to the second node N2;

the first output node control circuit 11 includes a third transistor T3, a fourth transistor T4, a fifth transistor T5, and a first capacitor C1;

a gate of the third transistor T3 is electrically connected to the first clock signal line CK, a source of the third transistor T3 is electrically connected to the INPUT terminal INPUT, and a drain of the third transistor T3 is electrically connected to the first output node N1;

a gate of the fourth transistor T4 is electrically connected to the second clock signal line CB, and a drain of the fourth transistor T4 is electrically connected to the first output node N1;

a gate of the fifth transistor T5 is electrically connected to the second node N2, a source of the fifth transistor T5 is electrically connected to a high voltage line VGH, and a drain of the fifth transistor T5 is electrically connected to a source of the fourth transistor T4;

a first electrode plate of the first capacitor C1 is electrically connected to the first output node N1, and a second electrode plate of the first capacitor C1 is electrically connected to the second clock signal line CB;

the third node control sub-circuit 51 includes a sixth transistor T6 and a second capacitor C2;

a gate of the sixth transistor T6 is electrically connected to the second node N2, a source of the sixth transistor T6 is electrically connected to the second clock signal line CB, and a drain of the sixth transistor T6 is electrically connected to the third node N3;

the first electrode plate of the second capacitor C2 is electrically connected to the second node N2, and the second electrode plate of the second capacitor C2 is electrically connected to the third node N3;

the second output node control sub-circuit 52 includes a seventh transistor T7, an eighth transistor T8, and a third capacitor C3;

a gate of the seventh transistor T7 is electrically connected to the second clock signal line CB, a source of the seventh transistor T7 is electrically connected to the third node N3, and a drain of the seventh transistor T7 is electrically connected to the second output node N4;

a gate of the eighth transistor T8 is electrically connected to the first output node N1, a source of the eighth transistor T8 is electrically connected to the high voltage line VGH, and a drain of the eighth transistor T8 is electrically connected to the second output node N4;

a first electrode plate of the third capacitor C3 is electrically connected to the second output node N4, and a second electrode plate of the third capacitor C3 is electrically connected to the high voltage line VGH;

the output circuit 14 includes a ninth transistor T9 and a tenth transistor T10, wherein, the gate of the ninth transistor T9 is electrically connected to the second output node N4, the source of the ninth transistor T9 is electrically connected to the high voltage line VGH, and the drain of the ninth transistor T9 is electrically connected to the output end OUT;

a gate of the tenth transistor T10 is electrically connected to the first output node N1, a source of the tenth transistor T10 is electrically connected to the output end OUT, and a drain of the tenth transistor T10 is electrically connected to a low voltage line VGL.

In the embodiment of the shift register unit shown in FIG. 7, the first voltage line is a high voltage line, and the second voltage line is a low voltage line.

In the embodiment shown in FIG. 7, all transistors are p-type thin film transistors, but not limited thereto.

Figure 8:
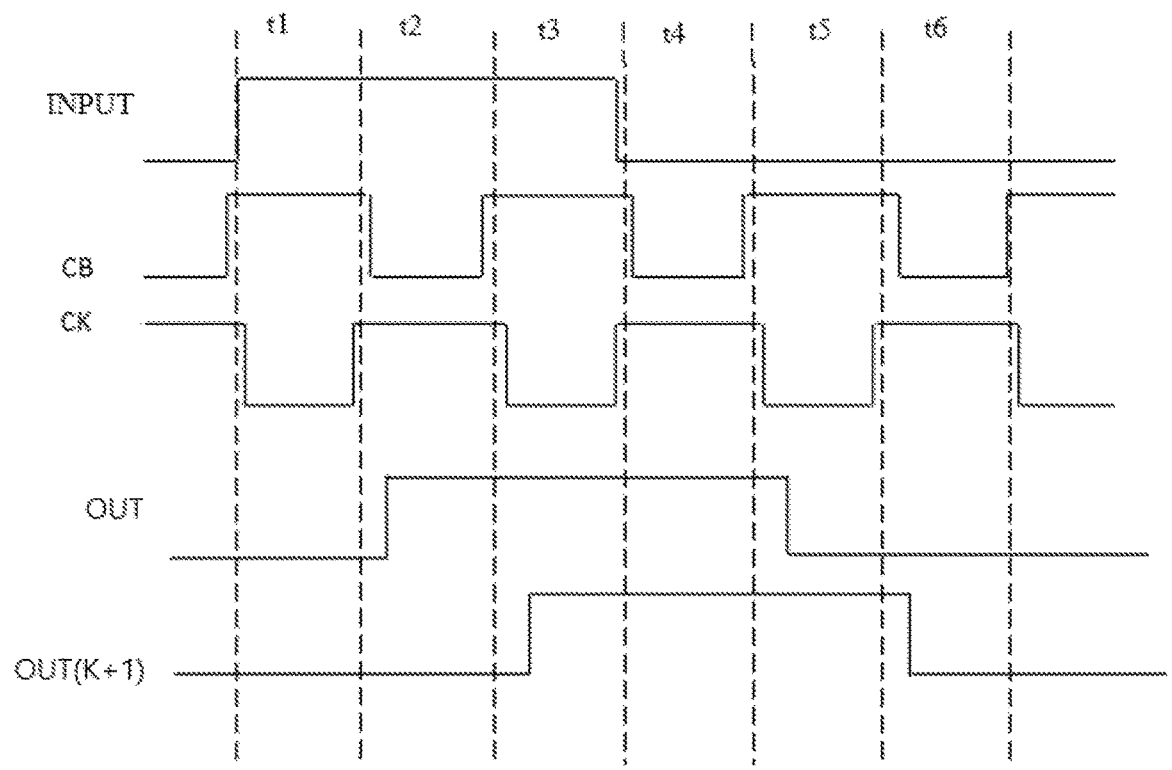
FIG. 8 is a timing diagram illustrating operation of at least one embodiment of the shift register unit shown in FIG. 7.

As shown in FIG. 8, in operation of the shift register unit embodiment of the present disclosure shown in FIG. 7, in a first stage T1, INPUT provides a high voltage, CB provides a high voltage, CK provides a low voltage, T3 is turned on, T1 is turned on, a potential of N2 is a low voltage, a potential of N1 is a high voltage, T6 is turned on, a potential of N3 is a high voltage, T7 is turned off, a potential of N4 is maintained at a high voltage, T2 is turned off, T4 is turned off, T5 is turned on, T9 and T10 are both turned off, and a potential of a light emission control signal output by OUT is maintained at a low voltage;

in a second stage T2, INPUT provides a high voltage, CB provides a low voltage, CK provides a high voltage, T1 and T3 are turned off, N2 is at a low voltage, T4 and T5 are both turned on, N1 is at a high voltage, T6 is turned on, N3 is at a low voltage, T7 is turned on, N4 is at a low voltage, T8 is turned off, T9 is turned on, T10 is turned off, and OUT provides a high voltage;

in a third stage T3, INPUT provides a high voltage, CB provides a high voltage, CK provides a low voltage, T1 and T3 are turned on, a potential of N2 is a low voltage, a potential of N1 is a high voltage, T2 is turned off, T4 is turned off, T6 is turned on, a potential of N3 is a high voltage, T7 is turned off, a potential of N4 is maintained as a low voltage, T9 is turned on, T10 is turned off, and OUT outputs a high voltage;

in a fourth stage T4, INPUT provides a low voltage, CB provides a low voltage, CK provides a high voltage, T1 and T3 are turned off, the potential of N2 is the low voltage, T4 and T5 are turned on, the potential of N1 becomes the high voltage, T8 is turned off, T6 is turned on, the potential of N3 is the low voltage, T7 is turned on, the potential of N4 is the low voltage, T9 is turned on, T10 is turned off, and OUT outputs the high voltage;

in a fifth stage T5, INPUT provides a low voltage, CB provides a high voltage, CK provides a low voltage, T1 and T3 are both on, the potential of N2 is the low voltage, the potential of N1 is the low voltage, T2 is on, T4 is off, T6 is on, the potential of N3 is the high voltage, T7 is off, T8 is on, the potential of N4 is the high voltage, T9 is off, T10 is on, and OUT outputs the low voltage;

in the sixth phase T6, INPUT provides low voltage, CB provides low voltage, CK provides high voltage, T1 and T3 are both off, N1 is at low voltage, T2 is on, N2 is at high voltage, T4 is on, T5 is off, T6 is off, N3 is at high voltage, T7 is on, N4 is at high voltage, T9 is off, T10 is on, and OUT outputs low voltage.

In FIG. 8, a reference numeral OUT (K+1) is a light-emitting control signal terminal of the K+1 th stage, and the light-emitting control signal terminal of the K+1 th stage is a light-emitting control signal terminal of the shift register unit of the K+1 th stage.

Figure 9:
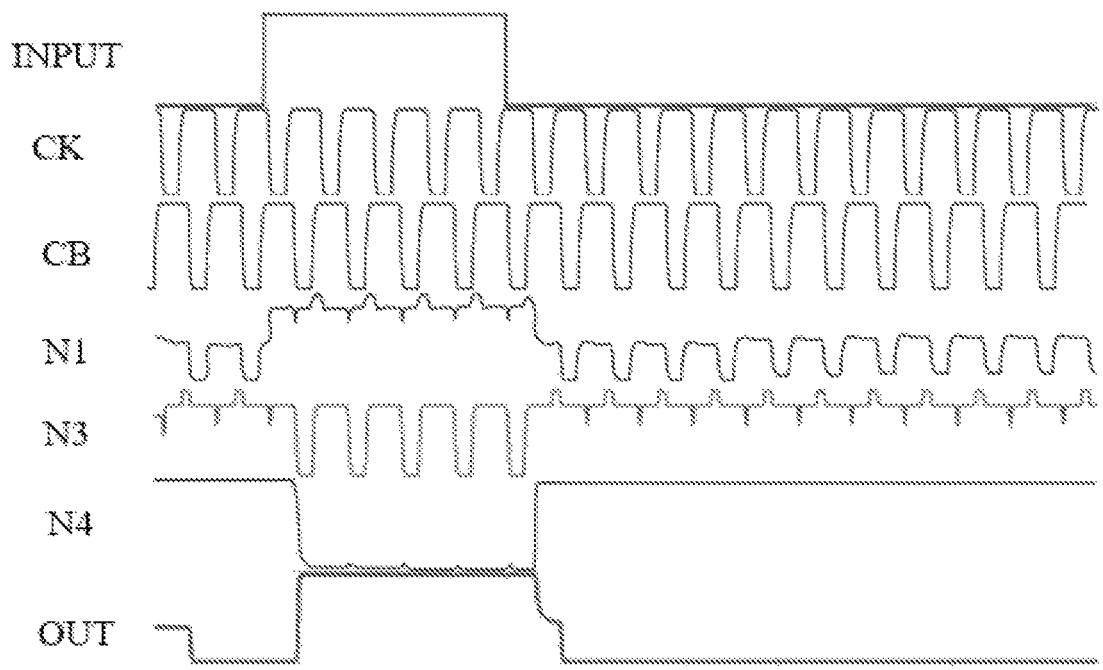
FIG. 9 is a simulated operation timing diagram of at least one embodiment of the shift register unit shown in FIG. 7.

FIG. 9 is a simulated operation timing diagram of the embodiment of the shift register unit shown in FIG. 7 of the present disclosure.

Figure 10:
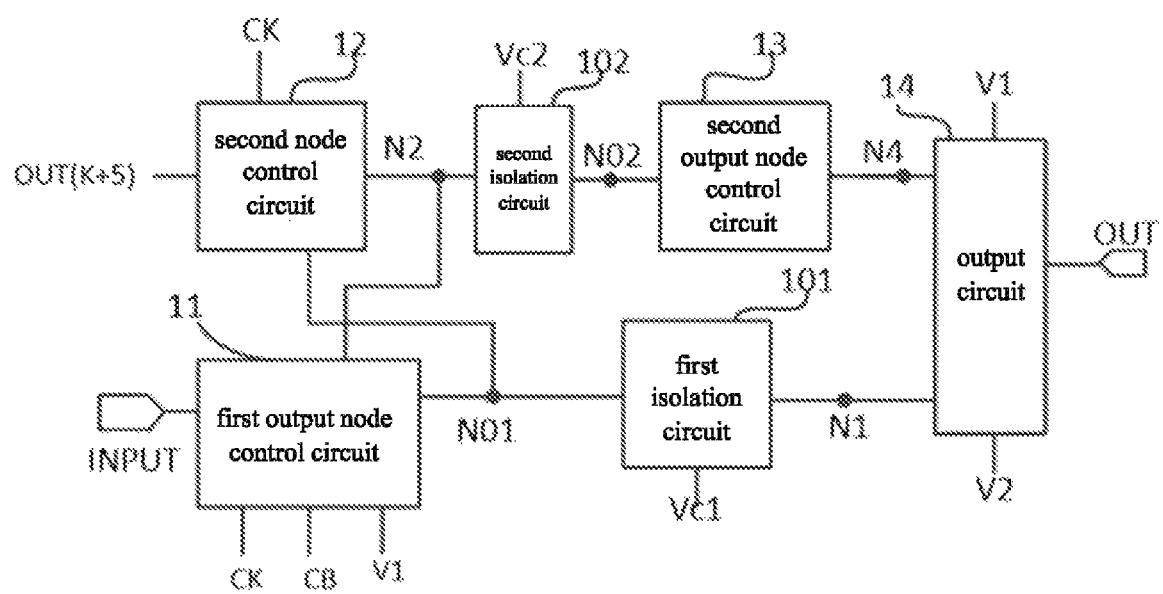
FIG. 10 is a block diagram of a shift register unit according to at least one embodiment of the present disclosure.

As shown in FIG. 10, on the basis of at least one embodiment of the shift register unit shown in FIG. 4, the shift register unit according to at least one embodiment of the present disclosure further includes a first isolation circuit 101 and a second isolation circuit 102;

the first isolation circuit 101 is electrically connected to a first control voltage line Vc1, and is configured to control communication between the first isolation node N01 and the first output node N1 under the control of a first control voltage supplied by the first control voltage line Vc1;

the first output node control circuit 11 is electrically connected to the first output node N1 through the first isolation circuit 101, the first output node control circuit 11 is directly electrically connected to the first isolation node N01, and the first output node control circuit 11 is configured to, under the control of the first clock signal, write an INPUT signal provided by the INPUT terminal INPUT into a first isolation node N01, and when the first isolation circuit 101 controls communication between the first isolation node N01 and the first output node N1, write the INPUT signal into the first output node N1;

the second output node control circuit 13 is electrically connected to the second node N2 through the second isolation circuit 102; a connection node of the second isolation circuit 102 and the second output control circuit 13 is a second isolation node N02;

the second isolation circuit 102 is further electrically connected to a second control voltage line Vc2, for controlling the communication between the second node N2 and the second output node control circuit 13 under the control of a second control voltage supplied by the second control voltage line Vc2.

In at least one embodiment of the shift register unit as shown in FIG. 10, the second node control circuit 12 is directly electrically connected to the first isolation node N01, and the second node control circuit 12 is electrically connected to the first output node N1 through the first isolation circuit 101; the second node control circuit 12 is configured to control the writing of the first clock signal into the second node N2 under the control of the potential of the first isolation node N01.

In at least one embodiment of the shift register unit shown in FIG. 10, when the first isolation transistor included in the first isolation circuit 101 is a p-type transistor, the Vc1 may be a low voltage line, and when the second isolation transistor included in the second isolation circuit 102 is a p-type transistor, the Vc2 may be a low voltage line.

In at least one embodiment of the shift register unit shown in FIG. 10, a first isolation circuit 101 and a second isolation circuit 102 are added to prevent the potential of N01 from being too low to affect the potential of N1, and prevent the potential of N02 from being too low to affect the potential of N2, thereby improving the stability of the circuit.

Figure 11:
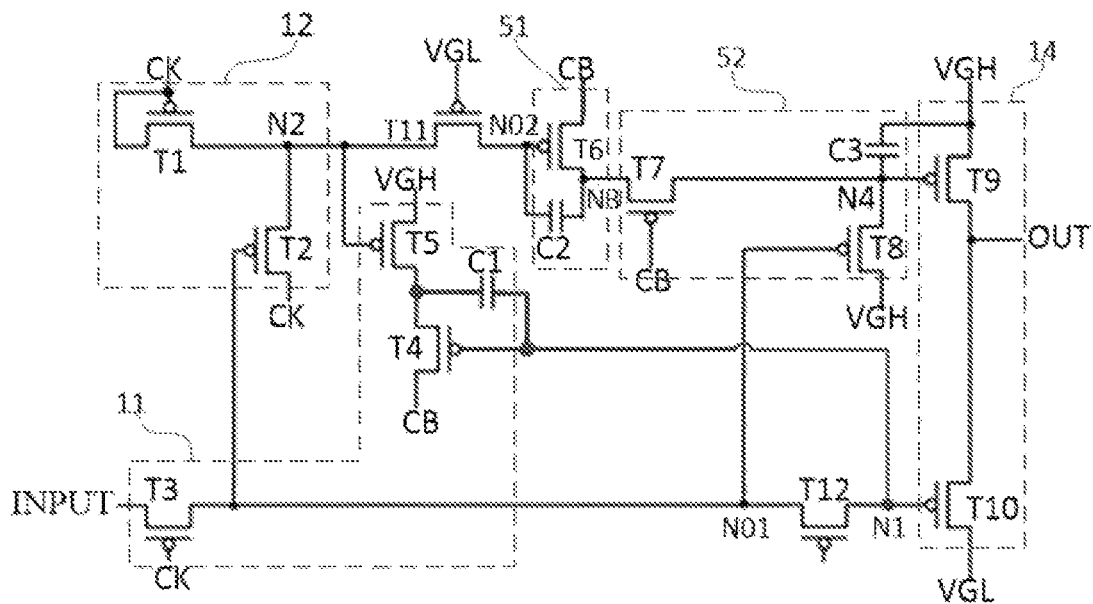
FIG. 11 is a circuit diagram of a shift register unit according to at least one embodiment of the present disclosure.

At least one embodiment of the shift register unit shown in FIG. 11 differs from at least one embodiment of the shift register unit shown in FIG. 7 in that:

a first isolation transistor T12 and a second isolation transistor T11 are added; the gate of T12 and the gate of T11 are electrically connected to a low voltage line VGL, the source of T12 is electrically connected to a first isolation node N01, and the drain of T12 is electrically connected to a first output node N1; the source of T11 is electrically connected to a second node N2, and the drain of T11 is electrically connected to a second isolation node N02; n02 is electrically connected to the grid of T6;

the gate of T8 is electrically connected to the first isolation node N01;

the drain of T4 is electrically connected to the second clock signal line CB, and the second electrode plate of C1 is electrically connected to the source of T4.

In at least one embodiment of the shift register unit shown in FIG. 11, all the transistors are p-type thin film transistors, but not limited thereto.

In operation of at least one embodiment of the shift register unit of the present disclosure as shown in FIG. 11, in the first stage, the second stage, the third stage and the fourth stage, when the potential of N1 is high voltage, T4 is turned off, the potential of N2 is low voltage, and T5 is turned on, the second electrode plate of C2 is connected to high voltage VGH, and the second electrode plate of C2 is not electrically connected to the second clock signal terminal CB, so that the influence of the jump of the potential of the second clock signal provided by CB on the potential of N1 is prevented, the turn-off of T10 is ensured, the influence of the turn-on of T10 on the potential of the signal output by OUT is prevented, and the output of high voltage by OUT is ensured;

in the fifth stage and the sixth stage, the potential of N1 is low voltage, T4 is open, and the second electrode plate of C2 is connected to the second clock signal terminal CB, so that when the potential of the second clock signal jumps from high voltage to low voltage, the potential of N1 can be pulled down further, which is favorable for OUT to output low voltage.

Figure 12A:
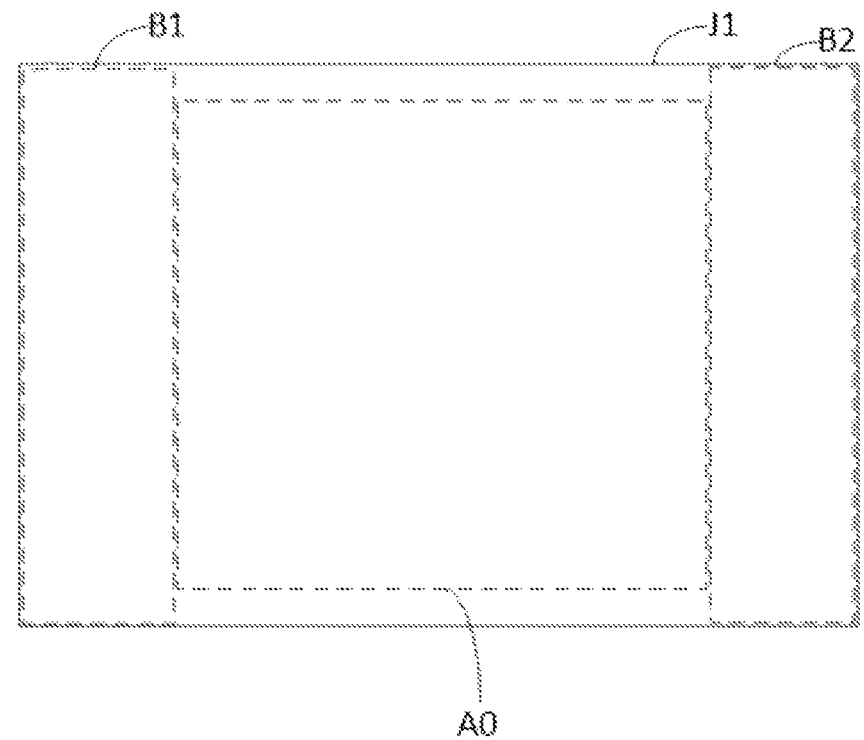
FIG. 12A is a schematic view of a region division of a display substrate according to at least one embodiment of the disclosure.

As shown in FIG. 12A, reference numeral J1 denotes a display substrate, reference numeral a0 denotes a display region, reference numeral B1 denotes a first edge region, and reference numeral B2 denotes a second edge region.

A plurality of light emission control lines, a plurality of gate lines and a plurality of data lines, and a plurality of subpixels defined by the intersections of the plurality of gate lines and the plurality of data lines may be disposed in the display region a0 of the display substrate J1;

a scanning drive circuit including a plurality of shift register units according to at least one embodiment of the present disclosure may be disposed in the first edge region B1 and/or the second edge region B2;

the scanning drive circuit comprises a plurality of shift register units which are in one-to-one correspondence with the plurality of light-emitting control lines, and each shift register unit is coupled with the corresponding light-emitting control line and configured to provide light-emitting control signals for the corresponding light-emitting control line.

In a specific implementation, one of the light-emitting control lines is coupled to the light-emitting control terminals of the corresponding row of pixel circuits.

Optionally, the display substrate further includes a plurality of rows of pixel circuits disposed on the base; the pixel circuit comprises a light-emitting control end;

The shift register units included in the scanning drive circuit correspond to the row pixel circuits one to one.

And the signal output line of the shift register unit is coupled with the light-emitting control end of the corresponding row of pixel circuits and is configured to provide a light-emitting control signal for the light-emitting control end of the corresponding row of pixel circuits.

In at least one embodiment of the present disclosure, the pixel circuit may be disposed in an effective display area of the display substrate, and the scanning drive circuit may be disposed in an edge area of the display substrate.

Figure 12B:
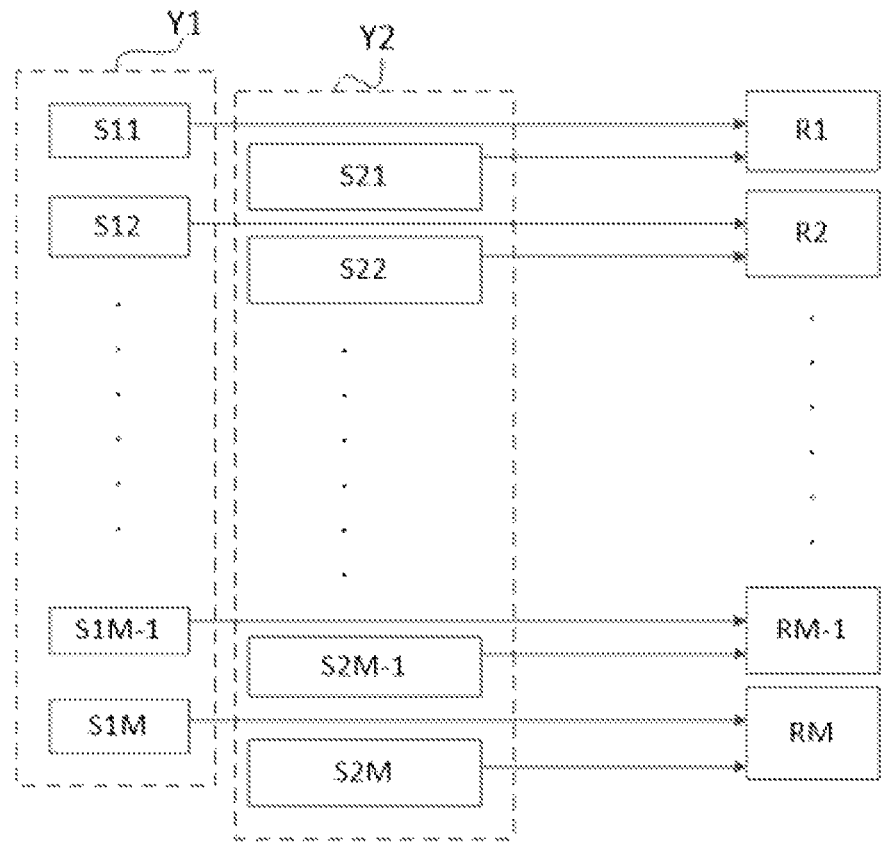
FIG. 12B is a schematic diagram illustrating a connection relationship between a scanning drive circuit and a pixel circuit included in a display substrate according to at least one embodiment of the disclosure.

As shown in FIG. 12B, reference numeral Y1 is a scanning drive circuit, reference numeral S11 is a first-stage shift register unit included in the scanning drive circuit S1, reference numeral S12 is a second-stage shift register unit included in the scanning drive circuit S1, reference numeral S1M−1 is an M−1-stage shift register unit included in the scanning drive circuit S1, reference numeral S1M is an M-th-stage shift register unit included in the scanning drive circuit S1, and M is an integer greater than 3;

in FIG. 12B, reference numeral R1 is a first row pixel circuit, reference numeral R2 is a second row pixel circuit, reference numeral RM−1 is an M−1 row pixel circuit, and reference numeral RM is an M-th row pixel circuit;

S11 corresponds to R1, S12 corresponds to R2, S1M−1 corresponds to RM−1, and S1M corresponds to RM;

S11 provides a first row light control signal for R1, S12 provides a second row light control signal for R2, S1M−1 provides an M−1 row light control signal for R1M−1, and S1M provides an M-th row light control signal for R1M.

Figure 12C:
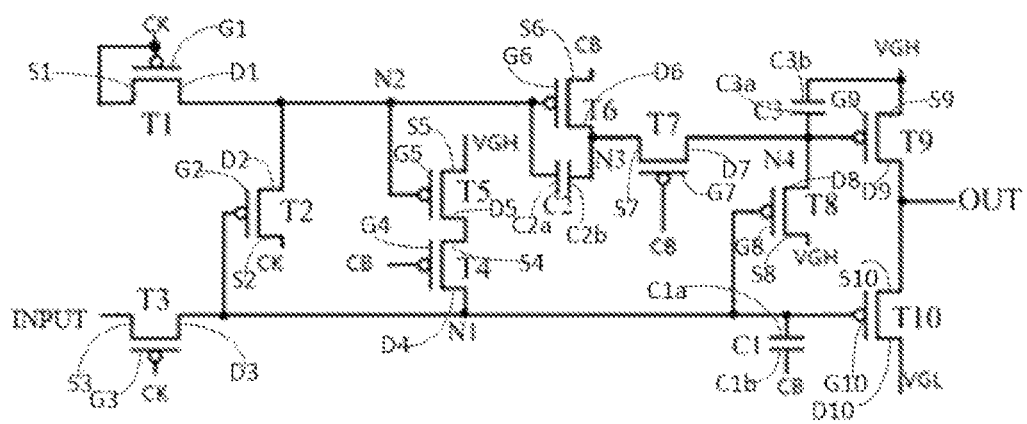
FIG. 12C is a circuit diagram of a shift register unit according to an embodiment of the present disclosure.
Figure 13:
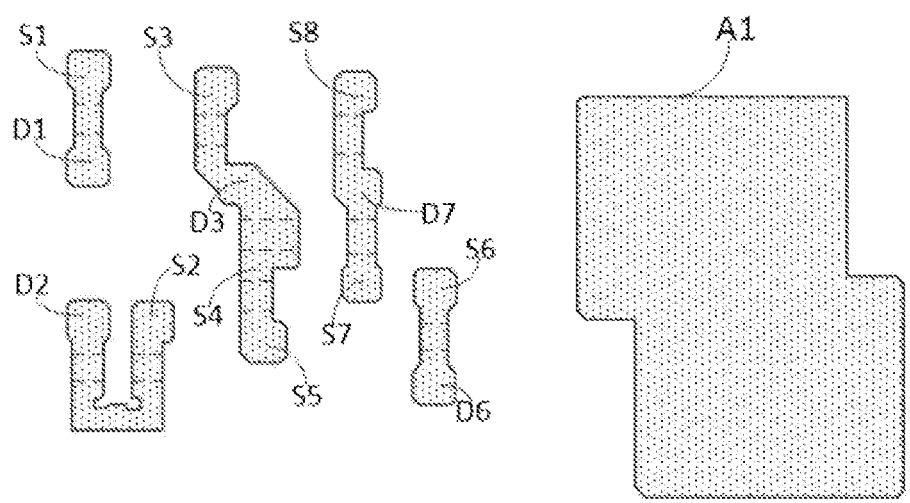
FIG. 13 is a schematic illustration of the active layer of FIG. 18.
Figure 14:
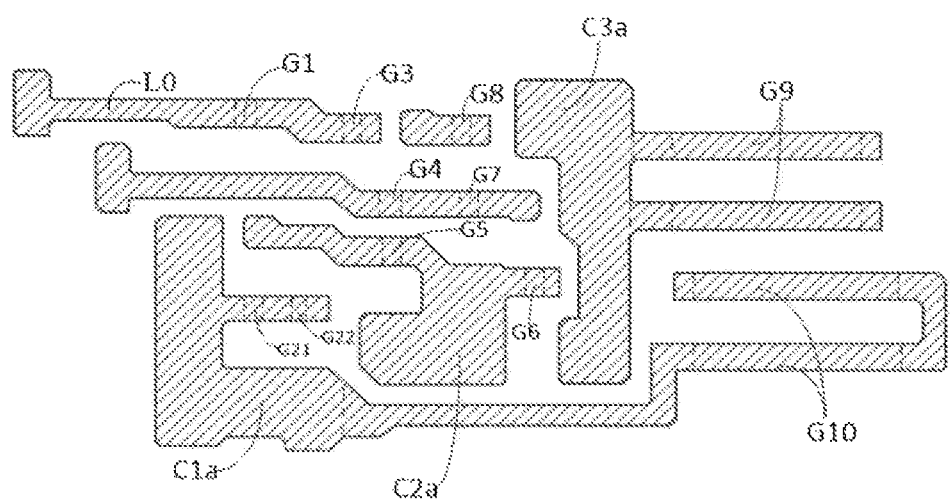
FIG. 14 is a schematic illustration of the first gate metal layer of FIG. 18.
Figure 15:
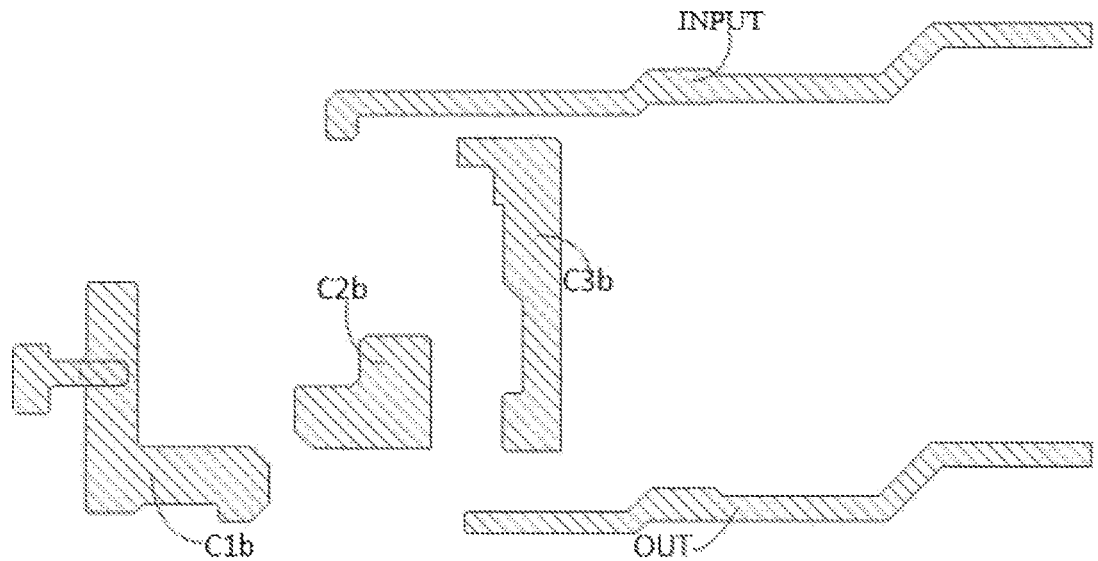
FIG. 15 is a schematic illustration of the second gate metal layer of FIG. 18.
Figure 16:
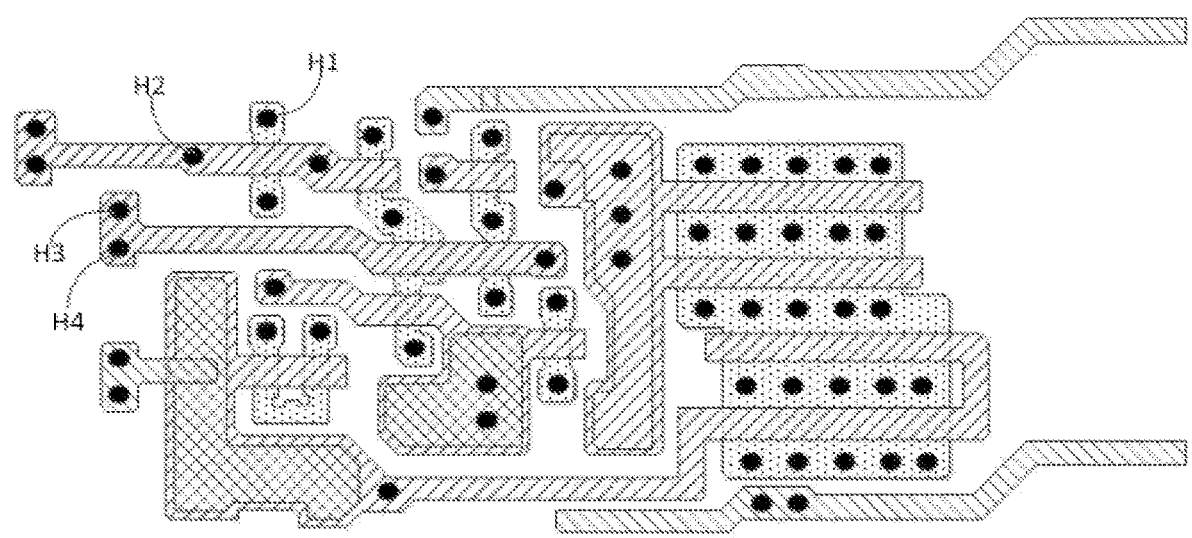
FIG. 16 is a schematic diagram of the vias of FIG. 18.
Figure 17:
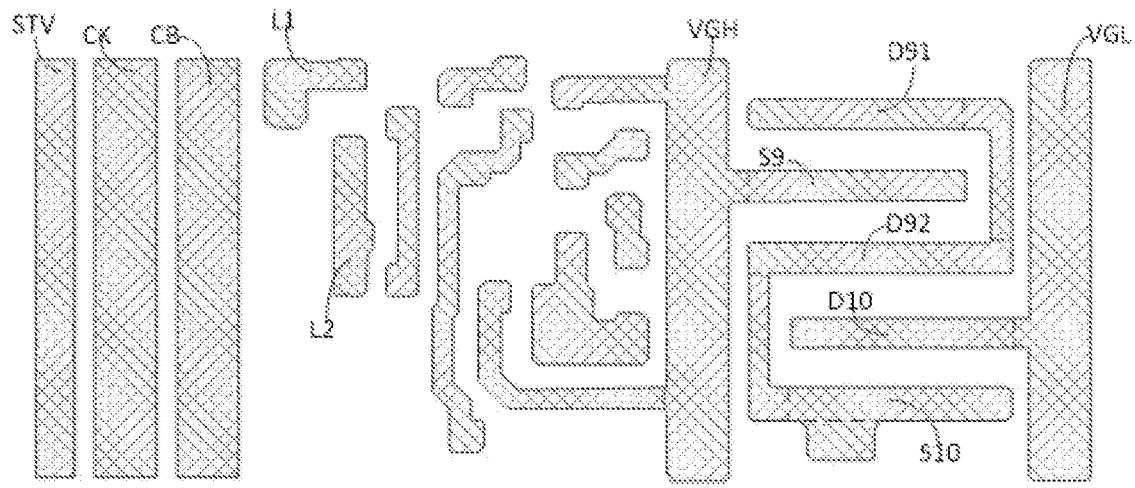
FIG. 17 is a schematic illustration of the source drain metal layers of FIG. 18.
Figure 18:
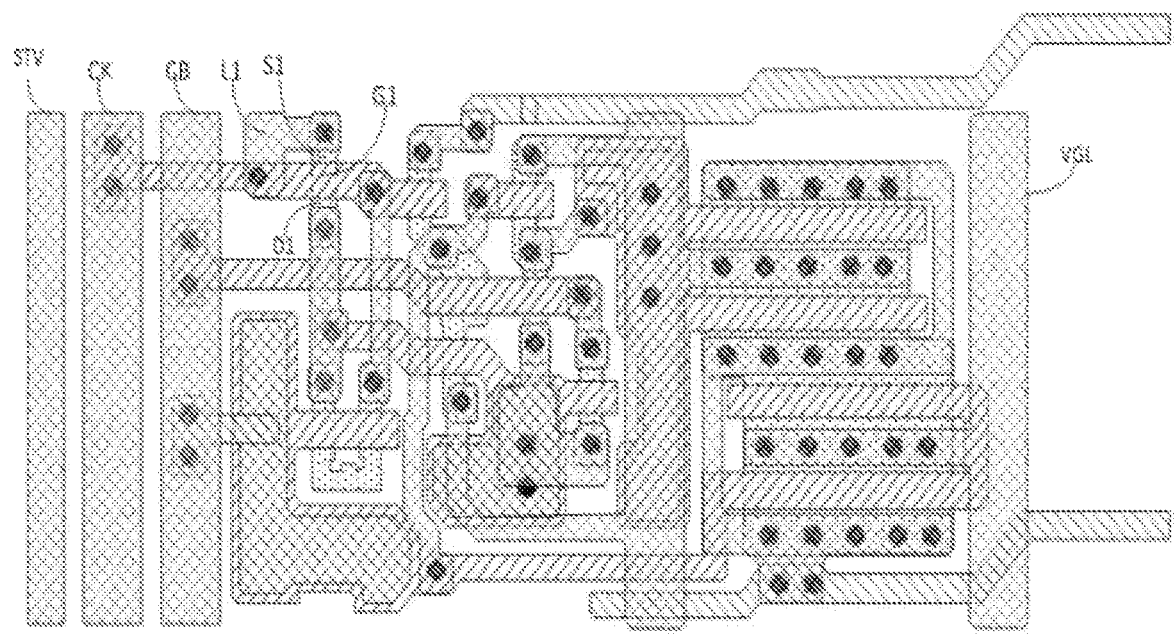
FIG. 18 is a schematic diagram of a layout of a shift register unit according to an embodiment of the present disclosure.

As shown in FIG. 12B, in the edge region, the display substrate may further include a gate driving circuit, where the gate driving circuit includes multiple stages of gate driving units, and the gate driving units are in one-to-one correspondence with the pixel rows and configured to provide corresponding gate driving signals for the pixels in the corresponding rows;

in FIG. 12B, reference numeral Y2 denotes a gate driving circuit, reference numeral S21 denotes a first row of gate driving units included in the gate driving circuit, reference numeral S22 denotes a second row of gate driving units included in the gate driving circuit, reference numeral S2M−1 denotes an M−1 th row of gate driving units included in the gate driving circuit, and reference numeral S2M denotes an M-th row of gate driving units included in the gate driving circuit. As shown in FIG. 12C, on the basis of the embodiment of the shift register unit shown in FIG. 7, the electrodes of the respective transistors, and the terminals of the respective capacitors are numbered;

in FIG. 12C, the gate labeled G1 is gate of T1, the source labeled S1 is source of T1, and the drain labeled D1 is drain of T1; a gate labeled G2 is gate of T2, a source labeled S2 is source of T2, and a drain labeled D2 is drain of T2; a gate labeled G3 is gate of T3, a source labeled S3 is source of T3, and a drain labeled D3 is drain of T3; a gate labeled G4 is gate of T4, a source labeled S4 is source of T4, and a drain labeled D4 is drain of T4; a gate labeled G5 is gate of T5, a source labeled S5 is source of T5, and a drain labeled D5 is drain of T5; a gate labeled G6 is gate of T6, a source labeled S6 is source of T6, and a drain labeled D6 is drain of T6; a gate labeled G7 is gate of T7, a source labeled S7 is source of T7, and a drain labeled D7 is drain of T7; a gate labeled G8 is gate of T8, a source labeled S8 is source of T8, and a drain labeled D8 is drain of T8; a gate labeled G9 is gate of T9, a source labeled S9 is source of T9, and a drain labeled D9 is drain of T9; a gate labeled G10 is gate of T10, a source labeled S10 is source of T10, and a drain labeled D10 is drain of T10;

a first electrode plate with C1 and C1a, a second electrode plate with C1 and C1b, a first electrode plate with C2 and C2a, a second electrode plate with C2 and C2b, a first electrode plate with C3a and C3 and a second electrode plate with C3b and C3. FIG. 18 shows a schematic layout diagram of a shift register unit according to an embodiment of the disclosure. FIG. 13 is a schematic view of an active layer in FIG. 18, FIG. 14 is a schematic view of a first gate metal layer in FIG. 18, and FIG. 15 is a schematic view of a second gate metal layer in FIG. 18; FIG. 16 is a schematic diagram of a via hole in FIG. 18, and FIG. 17 is a schematic diagram of a source drain metal layer in FIG. 18.

In specific implementation, the source layer, the first gate metal layer, the second gate metal layer and the source drain metal layer may be sequentially disposed on the substrate to form the display substrate.

In at least one embodiment of the present disclosure, the at least one shift register unit may include a plurality of transistors; the conductive portions at both sides of the channel portion of each transistor may correspond to the first electrode and the second electrode of the transistor, respectively, or may be coupled to the first electrode of the transistor and the second electrode of the transistor, respectively.

In at least one embodiment shown in FIG. 12C-18, the first voltage lines are high voltage lines VGH, and the second voltage lines are low voltage lines VGL.

As shown in FIG. 17, the first clock signal line CK, the second clock signal line CB, the high voltage line VGH, and the low voltage line VGL are all formed on the source-drain metal layer, and the first clock signal line CK, the second clock signal line CB, the high voltage line VGH, and the low voltage line VGL all extend along a first direction (in at least one embodiment shown in FIG. 12C to 18, the first direction may be a vertical direction, but is not limited thereto).

As shown in FIG. 12C-18, CK and CB are both located on a side of VGL away from the display area, CK and CB are disposed side by side and in close proximity, CK is disposed on a side of CB away from VGL, at least one embodiment of the shift register unit is located between VGL and CB, and an orthographic projection of the shift register unit on the substrate at least partially overlaps an orthographic projection of VGH on the substrate.

In at least one embodiment shown in FIG. 12C-18, the positions of CK and CB may be interchanged.

In at least one embodiment shown in FIG. 12C to 18, the ninth transistor T9 and the tenth transistor T10 included in the output circuit may be positioned between the high voltage line VGH and the low voltage line VGL.

In at least one embodiment shown in FIG. 12C to 18, since T9 is electrically connected to the high voltage line VGH and T10 is electrically connected to the low voltage line VGL, T9 and T10 are disposed between VGH and VGL, and a space between tenth transistors included in the shift register unit adjacent in the longitudinal direction is utilized to set the output end OUT such that T9 and T10 are disposed between VGH and VGL, and other signal lines and components included in other transistors are not disposed between the high voltage line VGH and an output circuit (which includes T9 and T10), and other signal lines and components included in other transistors are not disposed between the low voltage line VGL and the output circuit, and the distance from VGH to T9 and T10 is narrowed, and the distance from VGL to T9 and T10 is narrowed, so that the lateral width of the shift register unit is reduced.

As shown in FIG. 12C to 18, the source S1 of T1 and the gate G1 of T1 are both electrically connected to the first clock signal line CK.

As shown in FIGS. 13 to 18, the source S1 of the first transistor T1 is electrically connected to the first conductive connection portion L1 through the first via hole H1, and the gate G1 of the T1 is electrically connected to the conductive connection portion L0;

the conductive connection portion L0 is electrically connected to the first clock signal line CK through the third via hole H3 and the fourth via hole H4;

10 is electrically connected to L1 through the second via H2, so that S1 is electrically connected to the first clock signal line CK.

In at least one embodiment shown in FIG. 12C-18, the conductive connecting parts L0 and G1 are formed on the first gate metal layer, the first conductive connecting part L1, the first clock signal line CK and the second clock signal line CB are formed on the source-drain metal layer, and S1 is formed on the active layer.

By adopting the layout of the shift register unit shown in FIGS. 13 to 18, S1 is electrically connected to the first clock signal line CK, so that the use of a low voltage line can be reduced, the wiring is facilitated, and the space is saved.

In FIG. 13, reference numeral a1 denotes a first active pattern, reference numeral S1 denotes a source of T1, and reference numeral D1 denotes a drain of T1; a source labeled S2 is source of T2, a drain labeled D2 is drain of T2; a source labeled S3 is source of T3, a drain labeled D3 is drain of T3; a source labeled S4 is source of T4; a source labeled S5 is source of T5; a source labeled S6 is source of T6, a drain labeled D6 is drain of T6; a source labeled S7 is source of T7, a drain labeled D7 is drain of T7; labeled S8 is source of T8.

In the embodiments corresponding to FIG. 13-18, D7 is multiplexed as the drain of T8, D3 is multiplexed as the drain of T4, S4 is multiplexed as the drain of T5, and G2 is a double-gate transistor, but not limited thereto.

In FIG. 14, the gate denoted by G1 is gate of T1, the gate denoted by G21 is a first gate pattern of gate of T2, and the gate denoted by G22 is a second gate pattern of the gate of T2; a gate with a designation of G3 is gate of T3, a gate with a designation of G4 is gate of T4, a gate with a designation of G5 is gate of T5, a gate with a designation of G6 is gate of T6, a gate with a designation of G7 is gate of T7, a gate with a designation of G8 is gate of T8, a gate with a designation of G9 is gate of T9, a gate with a designation of G10 is gate of T10; a first electrode plate with the reference number of C1, C2a and C3, which are respectively labeled as C1a, C2 and C3a; reference numeral L0 denotes a conductive connection portion.

In FIG. 15, reference numeral INPUT is an INPUT terminal, reference numeral OUT is an output end, reference numeral C1b is a second electrode plate of C1, reference numeral C2b is a second electrode plate of C2, and reference numeral C3b is a second electrode plate of C3.

In FIG. 16, reference numeral H1 is a first via, reference numeral H2 is a second via, reference numeral H3 is a third via, and reference numeral H4 is a fourth via.

In FIG. 17, reference numeral STV is a start signal line, reference numeral CK is a first clock signal line, reference numeral CB is a second clock signal line, reference numeral L1 is a first conductive connection portion, reference numeral L2 is a second conductive connection portion, reference numeral VGH is a high voltage line, reference numeral VGL is a low voltage line, reference numeral D91 is a first electrode pattern included in the drain of T9, reference numeral D92 is a second electrode pattern included in the drain of T9, reference numeral D10 is the drain of T10, reference numeral S9 is the source of T9, reference numeral S10 is the source of T10.

In FIG. 18, reference numeral STV is a start signal line, reference numeral CK is a first clock signal line, reference numeral CB is a second clock signal line, reference numeral L1 is a first conductive connection portion, reference numeral VGH is a high voltage line, reference numeral VGL is a low voltage line, reference numeral G1 is a gate of T1, reference numeral S1 is a source of T1, and reference numeral D1 is a drain of T1.

Moreover, in at least one embodiment of the present disclosure, the first electrode plate C1a of C1 may be provided in an L shape, and in a case that the longitudinal space is sufficient, the electrode plate of C1 may be expanded longitudinally, so as to reduce the lateral space, which is beneficial to reducing the frame.

The embodiment of the shift register unit shown in FIG. 19 differs from the embodiment of the shift register unit shown in FIG. 7 in the following way:

the source electrode of T1 is electrically connected to the K+5th-stage emission control signal terminal OUT (K+5);

the (K+5)-th stage light-emitting control signal end is a light-emitting control signal end of the (K+5)-th stage shift register unit;

the light-emitting control signal terminal OUT is a K-th stage light-emitting control signal terminal, and K is a positive integer.

Figure 19:
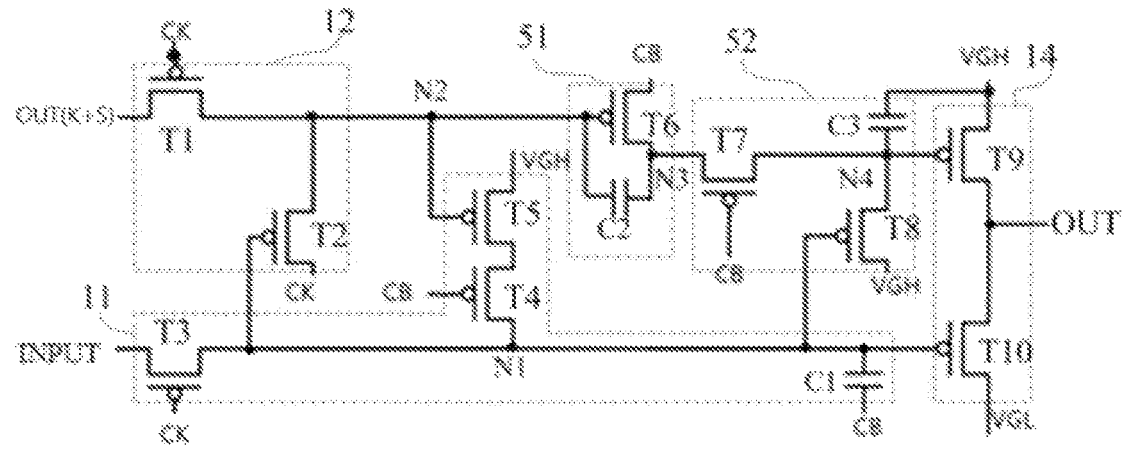
FIG. 19 is a circuit diagram of a shift register unit according to an embodiment of the disclosure.
Figure 20:
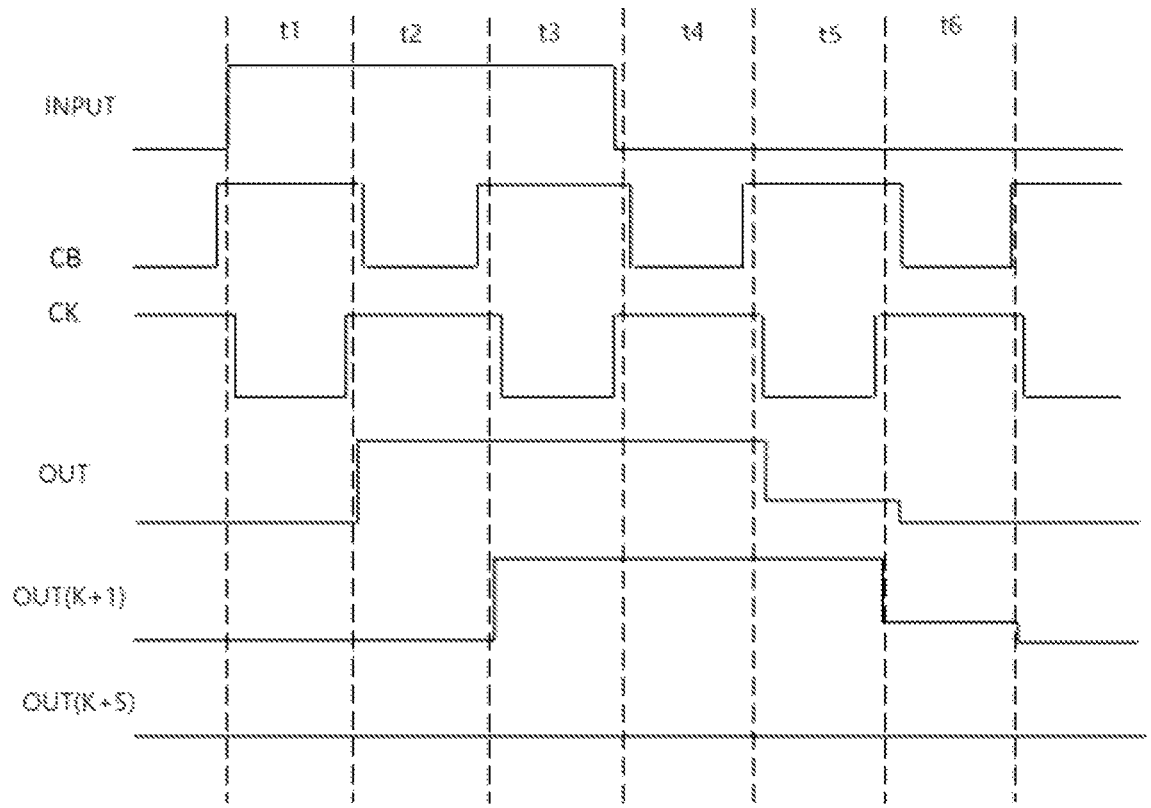
FIG. 20 is a timing diagram illustrating operation of the embodiment of the shift register unit shown in FIG. 19.

As shown in FIG. 20, in operation of the shift register unit embodiment of the present disclosure shown in FIG. 19, in a first phase T1, INPUT provides a high voltage, CB provides a high voltage, CK provides a low voltage, OUT (K+5) outputs a low voltage, T3 is turned on, T1 is turned on, the potential of N2 is a low voltage, the potential of N1 is a high voltage, T6 is turned on, the potential of N3 is a high voltage, T7 is turned off, the potential of N4 is maintained at a high voltage, T2 is turned off, T4 is turned off, T5 is turned on, T9 and T10 are both turned off, and the potential of a light emission control signal output by OUT is maintained at a low voltage;

in a second stage T2, INPUT provides a high voltage, CB provides a low voltage, CK provides a high voltage, OUT (K+5) outputs a low voltage, T1 and T3 are turned off, the potential of N2 is a low voltage, T4 and T5 are both turned on, the potential of N1 is a high voltage, T6 is turned on, the potential of N3 is a low voltage, T7 is turned on, the potential of N4 is a low voltage, T8 is turned off, T9 is turned on, T10 is turned off, and OUT provides a high voltage;

in a third stage T3, INPUT provides a high voltage, CB provides a high voltage, CK provides a low voltage, OUT (K+5) outputs a low voltage, T1 and T3 are turned on, the potential of N2 is a low voltage, the potential of N1 is a high voltage, T2 is turned off, T4 is turned off, T6 is turned on, T7 is turned off, the potential of N4 is maintained as a low voltage, T9 is turned on, T10 is turned off, and OUT outputs a high voltage;

in a fourth stage T4, INPUT provides a low voltage, CB provides a low voltage, CK provides a high voltage, OUT (K+5) outputs a low voltage, T1 and T3 are turned off, the potential of N2 is a low voltage, T4 and T5 are turned on, the potential of N1 becomes a high voltage, T8 is turned off, T6 is turned on, the potential of N3 is a low voltage, T7 is turned on, the potential of N4 is a low voltage, T9 is turned on, T10 is turned off, OUT outputs a high voltage;

in a fifth phase T5, INPUT provides a low voltage, CB provides a high voltage, CK provides a low voltage, OUT (K+5) outputs a low voltage, T1 and T3 are both on, the potential of N2 is a low voltage, the potential of N1 is a low voltage, T2 is on, T4 is off, T6 is on, the potential of N3 is a high voltage, T7 is off, T8 is on, the potential of N4 is a high voltage, T9 is off, T10 is on, OUT outputs a low voltage;

in the sixth phase T6, INPUT provides a low voltage, CB provides a low voltage, CK provides a high voltage, OUT (K+5) outputs a low voltage, T1 and T3 are both off, the potential of N1 is a low voltage, T2 is on, the potential of N2 is a high voltage, T4 is on, T5 is off, T6 is off, the potential of N3 is a high voltage, T7 is on, the potential of N4 is a high voltage, T9 is off, T10 is on, and OUT outputs a low voltage.

Figure 21:
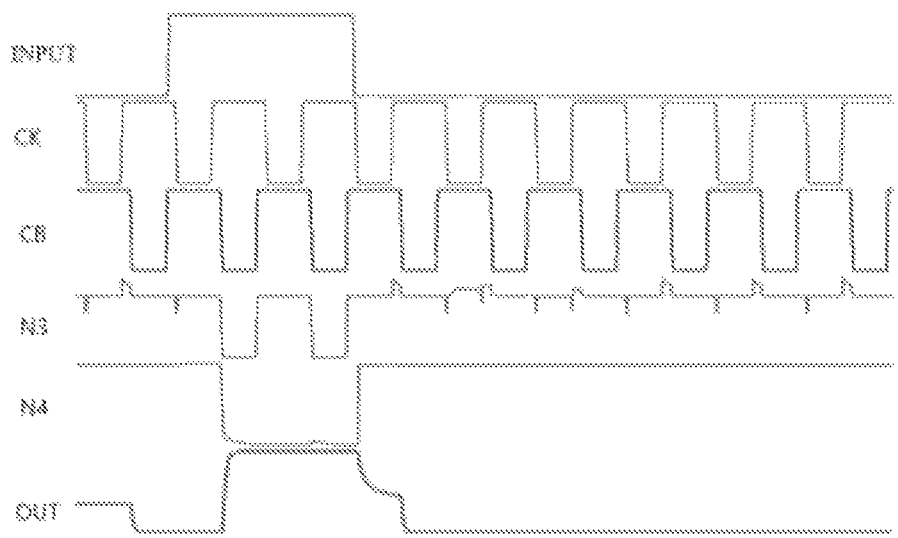
FIG. 21 is a simulated operational timing diagram of the embodiment of the shift register unit shown in FIG. 19.

FIG. 21 is a simulated operation timing diagram of the embodiment of the shift register unit shown in FIG. 19 of the present disclosure.

The display substrate comprises a scanning drive circuit and a display area, wherein the scanning drive circuit and the display area are arranged on a substrate, the scanning drive circuit comprises a plurality of shift register units, the scanning drive circuit further comprises a first voltage line, a second voltage line and a clock signal line, and the clock signal line comprises a first clock signal line and a second clock signal line; the first voltage line, the second voltage line, the first clock signal line, and the second clock signal line extend along a first direction, the display region includes at least one driving transistor configured to drive a light emitting element to display;

the first clock signal line and the second clock signal line are positioned on one side of the second voltage line far away from the display area, the shift register unit is positioned between the second voltage line and the clock signal line, and the orthographic projection of the shift register unit on the substrate is at least partially overlapped with the projection of the first voltage line on the substrate.

In the display substrate according to the embodiment of the disclosure, the shift register unit is disposed between the clock signal line and the second voltage line, and a forward projection of the shift register unit on the substrate at least partially overlaps a projection of the first voltage line on the substrate, so that the shift register unit is electrically connected to the clock signal line, the second voltage line and the first voltage signal line. Optionally, the second node control circuit included in the shift register unit is located between the clock signal line and the first voltage line.

Alternatively, the first clock signal line and the second clock signal line may be arranged side by side and next to each other, in particular implementations, the second node control circuit includes a first transistor; the gate of the first transistor is electrically connected to the conductive connecting part, and the gate of the first transistor and the conductive connecting part are both formed on the first grid metal layer; the conductive connecting part is connected to the first clock signal line through a corresponding via hole, so that the gate of the first transistor is electrically connected to the first clock signal line;

the source electrode of the first transistor is electrically connected to the first conductive connecting part through the corresponding through hole; the conductive connection part is electrically connected to the first conductive connection part through a corresponding via hole so that the source electrode of the first transistor is electrically connected to the first clock signal line;

the first conductive connecting part and the first clock signal line are formed on the source drain metal layer, and the source electrode of the first transistor is formed on the active layer.

In at least one embodiment of the present disclosure, the gate of the first transistor and the source of the first transistor are electrically connected to the first clock signal line, so that the number of voltage lines used can be reduced, and the first transistor can be disposed closer to the first clock signal line to facilitate electrical connection of the first transistor and the first clock signal line.

The scanning drive circuit comprises a plurality of stages of the shift register units.

In a specific implementation, the shift register unit may include an input end;

except for the first stage of shift register unit, the input end of each stage of shift register unit is electrically connected to the output end of the adjacent upper stage of shift register unit.

Figure 22:
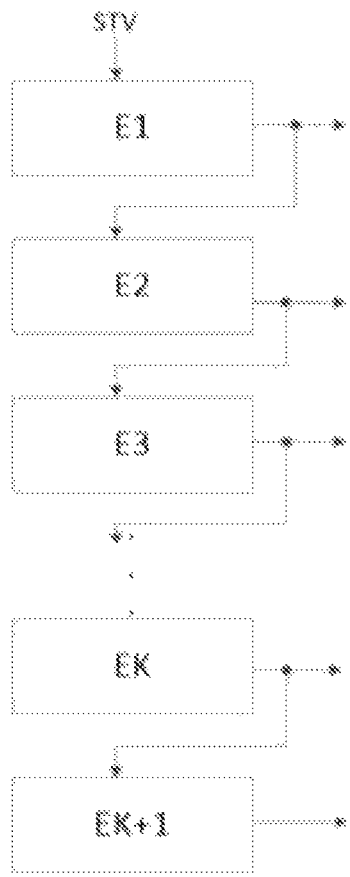
FIG. 22 is a structural diagram of a scanning drive circuit according to an embodiment of the present disclosure.

As shown in FIG. 22, the scanning drive circuit according to the embodiment of the disclosure includes a plurality of stages of the shift register units;

in FIG. 22, reference numeral E1 denotes a shift register unit of the first stage, reference numeral E2 denotes a shift register unit of the second stage, reference numeral E3 denotes a shift register unit of the third stage, reference numeral EK denotes a shift register unit of the K-th stage, and reference numeral EK+1 denotes a shift register unit of the K-th stage; k is a positive integer;

the input end of E1 is electrically connected to the start signal line STV;

the input end of E2 is electrically connected to the output end of E1; an input end of E3 is electrically connected to an output end of E2, and an input end of EK+1 is electrically connected to an output end of EK.

Optionally, the K-th stage shift register unit may include a K-th stage node control end and a K-th stage input end;

the K-th stage node control end is electrically connected to the (K+N)-th stage output end;

K and N are both positive integers;

the (K+N)-th stage light-emitting control signal end is configured to provide an effective voltage signal when the K-th stage input end provides an ineffective voltage signal.

The display device according to the embodiment of the present disclosure includes the scanning drive circuit.

The display device comprises the display substrate.

The display device provided by the embodiment of the disclosure can be any product or component with a display function, such as a mobile phone, a tablet computer, a television, a display, a notebook computer, a digital photo frame, a navigator and the like.

While the foregoing is directed to embodiments of the present disclosure, it will be appreciated by those skilled in the art that various changes and modifications may be made without departing from the principles of the disclosure, and it is intended that such changes and modifications be considered as within the scope of the disclosure.

What is claimed is:

1. A shift register unit, comprising an output end, a node control end, a first output node control circuit, a second node control circuit, a second output node control circuit and an output circuit, wherein the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node;

wherein the shift register unit further comprises an input end; the first output node control circuit is further electrically connected to the input end, the first output node, a first clock signal line, a second clock signal line, and a first voltage line, and is configured to, under the control of the first clock signal, write an input signal provided by the input end into the first output node, and control the potential of the first output node according to a potential of the second node, the second clock signal, and the first voltage signal;

the second clock signal line is configured to provide the second clock signal, and the first voltage line is configured to provide the first voltage signal.

2. The shift register unit according to claim 1, wherein the node control end is the first clock signal line.

3. The shift register unit according to claim 1, wherein the shift register unit comprises an output end being a K-th stage output end, and the node control end is a (K+N)-th stage output end;

K and N are both positive integers;

the (K+N)-th stage light-emitting control signal end is configured to provide an effective voltage signal when the input end provides an ineffective voltage signal.

4. The shift register unit according to claim 1, wherein the second node control circuit comprises a first transistor and a second transistor, wherein, a control electrode of the first transistor and a first electrode of the first transistor are both electrically connected to the first clock signal line, and a second electrode of the first transistor is electrically connected to the second node;

a control electrode of the second transistor is electrically connected to the first output node, a first electrode of the second transistor is electrically connected to the first clock signal line, and a second electrode of the second transistor is electrically connected to the second node.

5. The shift register unit according to claim 1, wherein the first output node control circuit comprises a third transistor, a fourth transistor, a fifth transistor, and a first capacitance;
a control electrode of the third transistor is electrically connected to the first clock signal line, a first electrode of the third transistor is electrically connected to the input end, and a second electrode of the third transistor is electrically connected to the first output node;
a control electrode of the fourth transistor is electrically connected to the second clock signal line, and a second electrode of the fourth transistor is electrically connected to the first output node; a control electrode of the fifth transistor is electrically connected to the second node, a first electrode of the fifth transistor is electrically connected to the first voltage line, and a second electrode of the fifth transistor is electrically connected to the first electrode of the fourth transistor;
a first electrode plate of the first capacitor is electrically connected to the first output node, and a second electrode plate of the first capacitor is electrically connected to the second clock signal line.

6. The shift register unit according to claim 1, wherein the first output node control circuit comprises a third transistor, a fourth transistor, a fifth transistor, and a first capacitance;
a control electrode of the third transistor is electrically connected to the first clock signal line, a first electrode of the third transistor is electrically connected to the input end, and a second electrode of the third transistor is electrically connected to the first output node;
a control electrode of the fourth transistor is electrically connected to the first output node, and a second electrode of the fourth transistor is electrically connected to the second clock signal line;
a control electrode of the fifth transistor is electrically connected to the second node, a first electrode of the fifth transistor is electrically connected to the first voltage line, and a second electrode of the fifth transistor is electrically connected to the first electrode of the fourth transistor;
a first electrode plate of the first capacitor is electrically connected to the first output node, and a second electrode plate of the first capacitor is electrically connected to the first electrode of the fourth transistor.

7. The shift register unit according to claim 1, further comprising a first isolation circuit;
the first isolation circuit is electrically connected to a first control voltage line and configured to control a first isolation node to be communicated with the first output node under a control of a first control voltage provided by the first control voltage line;
the first output node control circuit is configured to, under the control of the first clock signal, write an input signal provided by the input end into the first isolation node, and when the first isolation circuit controls communication between the first isolation node and the first output node, write the input signal into the first output node;
the second node control circuit is directly electrically connected to the first isolation node, and the second node control circuit is electrically connected to the first output node through the first isolation circuit; the second node control circuit is configured to control the first clock signal to be written into the second node under the control of the potential of the first isolation node.

8. The shift register unit according to claim 1, further comprising a second isolation circuit; the second output node control circuit is electrically connected to the second node through the second isolation circuit;
the second isolation circuit is further electrically connected to a second control voltage line and configured to control the second node to be communicated with the second output node control circuit under the control of a second control voltage provided by the second control voltage line.

9. The shift register unit according to claim 1, wherein the second output node control circuit is electrically connected to the first output node, the second node, a second clock signal line, and a first voltage line respectively, and is configured to control a potential of the second output node based on the second clock signal, a potential of the second node and the first voltage signal under a control of a potential of the second node, a potential of the first output node, and the second clock signal, and configured to maintain the potential of the second output node.

10. The shift register unit according to claim 9, wherein the second output node control circuit comprises a third node control sub-circuit and a second output node control sub-circuit, wherein,
the third node control sub-circuit is electrically connected to the second node, the second clock signal line and a third node respectively, and is configured to write a second clock signal into the third node under the control of the potential of the second node and adjust a potential of the third node according to the potential of the second node;
the second output node control sub-circuit is electrically connected to the third node, the second clock signal line, the second output node, the first output node and the first voltage line, and is configured to control a communication between the third node and the second output node under the control of the second clock signal, is configured to write a first voltage signal into the second output node under a control of the potential of the first output node, and is configured to maintain the potential of the second output node.

11. The shift register unit according to claim 10, wherein the third node control sub-circuit comprises a sixth transistor and a second capacitor;
a control electrode of the sixth transistor is electrically connected to the second node, a first electrode of the sixth transistor is electrically connected to the second clock signal line, and a second electrode of the sixth transistor is electrically connected to the third node;
a first electrode plate of the second capacitor is electrically connected to the second node, and a second electrode plate of the second capacitor is electrically connected to the third node;
the second output node control sub-circuit comprises a seventh transistor, an eighth transistor and a third capacitor;
a control electrode of the seventh transistor is electrically connected to the second clock signal line, a first electrode of the seventh transistor is electrically connected to the third node, and a second electrode of the seventh transistor is electrically connected to the second output node;
a control electrode of the eighth transistor is electrically connected to the first output node, a first electrode of the eighth transistor is electrically connected to the first voltage line, and a second electrode of the eighth transistor is electrically connected to the second output node;

a first electrode plate of the third capacitor is electrically connected to the second output node, and a second electrode plate of the third capacitor is electrically connected to the first voltage line.

12. The shift register unit according to claim 1, wherein the output circuit comprises a ninth transistor and a tenth transistor, wherein, a control electrode of the ninth transistor is electrically connected to the second output node, a first electrode of the ninth transistor is electrically connected to the first voltage line, and a second electrode of the ninth transistor is electrically connected to the output end;

a control electrode of the tenth transistor is electrically connected to the first output node, a first electrode of the tenth transistor is electrically connected to the output end, and a second electrode of the tenth transistor is electrically connected to the second voltage line.

13. A scanning drive circuit, comprising a plurality of stages of shift register units, wherein each of the shift register units comprises an output end, a node control end, a first output node control circuit, a second node control circuit, a second output node control circuit and an output circuit, wherein the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node;

wherein the shift register unit further comprises an input end; the first output node control circuit is further electrically connected to the input end, the first output node, a first clock signal line, a second clock signal line, and a first voltage line, and is configured to, under the control of the first clock signal, write an input signal provided by the input end into the first output node, and control the potential of the first output node according to a potential of the second node, the second clock signal, and the first voltage signal;

the second clock signal line is configured to provide the second clock signal, and the first voltage line is configured to provide the first voltage signal.

14. The scanning drive circuit according to claim 13, excepting for a first stage of shift register unit, the input end of each stage of shift register unit is electrically connected to the output end of the adjacent upper stage of shift register unit.

15. The scanning drive circuit according to claim 13, wherein the K-th stage shift register unit comprises a K-th stage node control end and a K-th stage input end;

the K-th stage node control end is electrically connected to the (K+N)-th stage output end;

K and N are both positive integers;

the (K+N)-th stage light-emitting control signal end is configured to provide an effective voltage signal when the K-th stage input end provides an ineffective voltage signal.

16. A display substrate, comprising a scanning drive circuit and a display region arranged on a substrate, the scanning drive circuit comprises a plurality of shift register units, the shift register unit comprises an output end, a node control end, a first output node control circuit, a second node control circuit, a second output node control circuit and an output circuit, wherein the second node control circuit is electrically connected to a first clock signal line, the node control end, the first output node and the second node, is configured to control providing a node control signal provided by the node control end to the second node under a control of a first clock signal provided by the first clock signal line, and is further configured to control a potential of the second node according to a potential of the first output node and the first clock signal;

the first output node control circuit is electrically connected to the second node and the first output node and is configured to control a potential of the first output node;

the second output node control circuit is electrically connected to the second node and the second output node and is configured to control a potential of the second output node;

the output circuit is electrically connected to a first output node, a second output node, a first voltage line, a second voltage line and an output end, and is configured to control a light-emitting control signal output by the output end according to a first voltage signal provided by the first voltage line and a second voltage signal provided by the second voltage line under a control of the potential of the first output node and the potential of the second output node;

wherein the shift register unit further comprises an input end; the first output node control circuit is further electrically connected to the input end, the first output node, a first clock signal line, a second clock signal line, and a first voltage line, and is configured to, under the control of the first clock signal, write an input signal provided by the input end into the first output node, and control the potential of the first output node according to a potential of the second node, the second clock signal, and the first voltage signal;

the second clock signal line is configured to provide the second clock signal, and the first voltage line is configured to provide the first voltage signal;

the scanning drive circuit further comprises a first voltage line, a second voltage line and a clock signal line, wherein the clock signal line comprises a first clock signal line and a second clock signal line; the first voltage line, the second voltage line, the first clock signal line, and the second clock signal line extend along a first direction, the display region includes at least one driving transistor configured to drive a light emitting element to display;

the first clock signal line and the second clock signal line are positioned on one side of the second voltage line far away from the display area, the shift register unit is positioned between the second voltage line and the clock signal line, and the orthographic projection of the shift register unit on the substrate is at least partially overlapped with the projection of the first voltage line on the substrate.

17. The display substrate according to claim 16, wherein the shift register unit comprises a second node control circuit between the clock signal line and the first voltage line.

18. The display substrate according to claim 17, wherein the second node control circuit comprises a first transistor; a gate of the first transistor is electrically connected to a conductive connecting part, and the gate of the first transistor and the conductive connecting part are both formed on the first grid metal layer; the conductive connecting part is connected to the first clock signal line through a corresponding via hole, so that the gate of the first transistor is electrically connected to the first clock signal line;

the source electrode of the first transistor is electrically connected to the first conductive connecting part through the corresponding through hole; the conductive connection part is electrically connected to the first conductive connection part through a corresponding via hole to enable the source electrode of the first transistor to electrically connect to the first clock signal line; the first conductive connecting part and the first clock signal line are formed on the source drain metal layer, and the source electrode of the first transistor is formed on the active layer.

19. A display device comprising the scanning drive circuit according to claim 13.

* * * * *